(12) United States Patent
Akiyama et al.

(10) Patent No.: US 7,023,754 B2
(45) Date of Patent: Apr. 4, 2006

(54) SEMICONDUCTOR DEVICE HAVING STANDBY MODE AND ACTIVE MODE

(75) Inventors: Mihoko Akiyama, Hyogo (JP); Fukashi Morishita, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 385 days.

(21) Appl. No.: 10/279,069

(22) Filed: Oct. 24, 2002

(65) Prior Publication Data

US 2003/0234406 A1    Dec. 25, 2003

(30) Foreign Application Priority Data

Jun. 19, 2002    (JP)    ............... 2002-178009

(51) Int. Cl.
  *G11C 7/00*    (2006.01)
(52) U.S. Cl. ...................... 365/226; 365/227
(58) Field of Classification Search ............... 365/226, 365/229, 230.03, 233
  See application file for complete search history.

(56) References Cited

U.S. PATENT DOCUMENTS

| | | | |
|---|---|---|---|
| 5,337,270 A | 8/1994 | Kawata et al. | |
| 5,337,284 A * | 8/1994 | Cordoba et al. | 365/227 |
| 6,313,694 B1 * | 11/2001 | Sohn | 327/540 |
| 6,407,958 B1 * | 6/2002 | Kato et al. | 365/226 |
| 6,429,725 B1 * | 8/2002 | Tanzawa et al. | 327/536 |
| 6,624,685 B1 * | 9/2003 | Shih et al. | 327/541 |
| 6,677,804 B1 * | 1/2004 | Pekny | 327/539 |
| 6,724,242 B1 * | 4/2004 | Kim et al. | 327/536 |
| 6,744,687 B1 * | 6/2004 | Koo et al. | 365/226 |

FOREIGN PATENT DOCUMENTS

| | | |
|---|---|---|
| JP | 3-288218 | 12/1991 |
| JP | 6-44779 | 2/1994 |
| JP | 7-307443 | 11/1995 |

* cited by examiner

*Primary Examiner*—Trong Phan
(74) *Attorney, Agent, or Firm*—Leydig, Voit & Mayer, Ltd.

(57) ABSTRACT

An internal potential generation circuit of an SDRAM includes a standby VDDS generation circuit which has a relatively low current driving force and which generates an internal power supply potential, and an active VDDS generation circuit which has a relatively high current driving force, which is activated during a period after an external power supply potential is applied until a negative potential reaches a threshold potential, and in an activation period, and which generates the internal power supply potential. Therefore, it is possible to raise the internal power supply potential stably without increasing standby current when the power supply is turned on.

10 Claims, 23 Drawing Sheets

SEMICONDUCTOR DEVICE HAVING STANDBY MODE AND ACTIVE MODE

BACKGROUND OF THE INVENTION

1. Field of the Invention

The present invention relates to a semiconductor device, and more particularly to a semiconductor device which has a standby mode and an active mode.

2. Description of the Background Art

Conventionally, an eDRAM on which a logic circuit and a DRAM are embedded on the same chip has a dual-oxide structure. In the dual-oxide structure, a circuit driven by an external power supply voltage VDDH, which is a relatively high voltage, for a DRAM, consists of thick film transistors, and a circuit driven by a power supply voltage, which is a relatively low voltage for a logic circuit, consists of thin film transistors. In addition, an external power supply voltage VDDH is lowered to generate an internal power supply voltage VDDS for sense amplifiers, a bit line precharge voltage VBL=VDDS/2 is generated from internal power supply voltage VDDS, and each sense amplifier consists of thin film transistors to accelerate operating rate and decrease power consumption.

FIG. 28 is a block diagram which shows the important parts of a DRAM of this type. In FIG. 28, the DRAM includes a standby VDDS generation circuit 130, a signal generation circuit 131, and an active VDDS generation circuit 132. Standby VDDS generation circuit 130 has a relatively low current driving force, is always activated, is driven by external power supply voltage VDDH, and supplies a current to an internal power supply voltage potential VDDS line so that internal power supply potential VDDS becomes equal to a reference potential VR.

Signal generation circuit 131 sets a signal ACTVDCE at "H" level when a signal φACT is set at "H" level, and sets ACTVDCE at "L" level when a signal φPRE is set at "H" level. Signal φACT is a signal which is set at "H" level in response to an active command ACT, and signal φPRE is a signal which is set at "L" level in response to a precharge command PRE.

Active VDDS generation circuit 132 has a relatively high current driving force, is activated only while output signal ACTVDCE of signal generation circuit 131 is at "H" level, is driven by external power supply voltage VDDH, and supplies a current to the internal power supply potential VDDS line so that internal power supply potential VDDS becomes equal to reference potential VR.

Therefore, a current is supplied from standby VDDS generation circuit 130 in a standby period in which power consumption is low and a current is supplied from both standby VDDS generation circuit 130 and active VDDS generation circuit 132 in an active period in which power consumption is high, thereby keeping internal power supply potential VDDS equal to reference potential VR.

FIG. 29 is a circuit diagram which shows the configuration of standby VDDS generation circuit 130. In FIG. 29, standby VDDS generation circuit 130 includes P-channel MOS transistors 140 to 142 and N-channel MOS transistors 143 to 145. P-channel MOS transistors 141 and 142 are connected between an external power supply potential VDDH line and nodes N141, N142, respectively, and the gates thereof are both connected to node N142. P-channel MOS transistors 141 and 142 constitute a current mirror circuit.

N-channel MOS transistors 143 and 144 are connected between nodes N141, N142 and a node N143, respectively, and the gates thereof receive reference potential VR and internal power supply potential VDDS, respectively. N-channel MOS transistor 145 is connected between node N143 and a ground potential GND line and the gate thereof receives a bias voltage VB. A constant pass current Ib flows in N-channel MOS transistor 145. MOS transistors 141 to 145 constitute a differential amplifier. P-channel MOS transistor 140 is connected between the external power supply potential VDDH line and an internal power supply potential VDDS line and the gate thereof is connected to node N141.

If internal power supply potential VDDS is lower than reference potential VR, then a current which flows in P-channel MOS transistor 141 becomes lower than a current which flows in N-channel MOS transistor 143, the level of node N141 is lowered to "L" level and P-channel MOS transistor 140 becomes conductive. As a result, a current is supplied from the external power supply potential VDDH line to the internal power supply potential VDDS line through P-channel MOS transistor 140, and internal power supply potential VDDS rises. If internal power supply potential VDDS is higher than reference potential VR, then the current which flows in P-channel MOS transistor 141 becomes higher than the current which flows in N-channel MOS transistor 143, the level of node N141 is raised to "H" level and P-channel MOS transistor 140 becomes nonconductive. If internal power supply potential VDDS is consumed, internal power supply potential VDDS lowers. Accordingly, internal power supply potential is kept equal to reference potential VR.

FIG. 30 is a circuit diagram which shows the configuration of a VBL generation circuit 150 which generates bit line precharge potential VBL which is a half of internal power supply potential VDDS. In FIG. 30, VBL generation circuit 150 includes resistance elements 151 and 152, N-channel MOS transistors 153 and 154, and P-channel MOS transistors 155 and 156. Resistance element 151, N-channel MOS transistor 153, P-channel MOS transistor 155 and resistance element 152 are connected in series between an internal power supply potential VDDS line and a ground potential GND line. The gate of N-channel MOS transistor 153 is connected to the drain thereof (a node N151), the gate of P-channel MOS transistor 155 is connected to the drain thereof (a node N152). Each of MOS transistors 153 and 155 constitute a diode element.

N-channel MOS transistor 154 and P-channel MOS transistor 156 are connected between an external power supply potential VDDH line and the ground potential GND line and the gates thereof are connected to nodes N151 and N152, respectively. A node N154 between MOS transistors 154 and 156 is connected to a bit line precharge potential VBL line. To prevent the transistors from being broken by external power supply voltage VDDH, each of MOS transistors 153 to 156 is formed into a thick film transistor having a thick gate oxide film.

The resistance values of resistance elements 151 and 152 and the sizes of MOS transistors 153 and 155 are set so that the potential of a node N153 between MOS transistors 153 and 155 becomes VDDS/2. If it is assumed that the threshold voltage of an N-channel MOS transistor is Vthn and that of a P-channel MOS transistor is Vthp, the potentials of nodes N151 and N152 are VDDS/2+Vthn and VDDS/2−Vthp, respectively. Therefore, potential VBL of node N154 is VDDS/2.

However, if internal power supply potential VDDS is lowered to approximately 1.2 to 1.5 V, it is difficult for VBL generation circuit 150 shown in FIG. 30 to generate bit line precharge potential VBL. This is because threshold voltage Vthp of P-channel MOS transistor 155 which is a thick film transistor is 0.8 V and the potential of node N153 cannot be made lower than threshold voltage Vthp of P-channel MOS transistor 155.

Under these circumstances, a VBL generation circuit 160 capable of generating bit line precharge potential VBL even if internal power supply potential VDDS is lowered, has been proposed. As shown in FIG. 31, VBL generation circuit 160 is constituted so that N-channel MOS transistors 153 and 154 and P-channel MOS transistors 155 and 156 are replaced by N-channel MOS transistors 163 and 164 and P-channel MOS transistors 165 and 166, respectively, and that internal power supply potential VDDS is applied to the drain of N-channel MOS transistor 164. Each of MOS transistors 163 to 166 are constituted out of a thin film transistor having a thin gate oxide film and has a threshold voltage (approximately 0.4 to 0.5 V) lower than that of a thick film transistor. The reason for applying internal power supply potential VDDS instead of external power supply potential VDDH to the drain of N-channel MOS transistor 164 is to prevent MOS transistors 164 and 166 from being broken by external power supply potential VDDH. According to VBL generation circuit 160, even if internal power supply voltage VDDS is lowered, it is possible to set the potential of node N153 between MOS transistors 163 and 165 higher than threshold voltage Vthp of P-channel MOS transistor 165, to generate bit line precharge potential VBL and to generate cell plate potential VCP by the same circuit as VBL generation circuit 160.

Nevertheless, if VBL generation circuit 160 is employed, the load capacitance of internal power supply potential VDDS disadvantageously increases, making internal power supply potential VDDS unstable. Namely, as shown in FIG. 29, if internal power supply potential VDDS is lower than reference potential VR, the potential of node N141 decreases and a current is supplied from the external power supply VDDH line to the internal power supply potential VDDS line through P-channel MOS transistor 140 until internal power supply potential VDDS becomes equal in level to reference potential VR. If it is assumed herein that the potential change of node N141 is $\Delta V$ and the gate capacitance of P-channel MOS transistor 140 is C, then time T for lowering the potential of node N141 by $\Delta V$ is expressed as $T=\Delta VC/Ib$ (sec). In a standby mode, internal power supply potential VDDS is hardly consumed. Due to this, the size of P-channel MOS transistor 140 is set small. If P-channel MOS transistor 140 is made large in size, gate capacitance C increases and the response of standby VDDS generation circuit 130 deteriorates. The size of P-channel MOS transistor 140 is, therefore, optimized to a size according to pass current Ib.

In a standby mode, internal power supply potential VDDS is hardly consumed and the quantity of charge to be supplied through P-channel MOS transistor 140 is small, so that potential change $\Delta V$ of node N141 may be small. Due to this, time T for lowering the potential N141 may be short (T<0.1 ms) and the charge supply capability and response of the circuit are not adversely influenced. In addition, when a potential is applied, the internal power supply potential VDDS line is charged by this standby VDDS generation circuit 130. However, unless internal power supply potential VDDS is used as a current supply source for the VBL generation circuit and the VCP generation circuit, internal power supply potential VDDS is not consumed. As a result, it is possible to raise internal power supply potential VDDS in short time which is approximately equal to power-on time (200 μs) without causing any problem.

However, if internal power supply potential VDDS is used as a current supply source for the VBL generation circuit and the VCP generation circuit, power is greatly consumed when a potential is applied. Due to this, it is necessary to increase potential change $\Delta V$ of node N141 to carry high current to P-channel MOS transistor 140. If potential change $\Delta V$ is set at approximately 2 V, time $T=\Delta VS/Ib$ becomes not less than several nanoseconds. Further, if internal power supply potential VDDS reaches reference potential VR, it is necessary to return the level of node N141 to "H" level. To do so, it is also necessary to take a time of not less than several nanoseconds, similar to a case where internal power supply potential VDDS becomes lower than reference potential VR.

In this way, an operation that the VDDS generation circuit cannot respond in not less than several nanoseconds since internal power supply potential VDDS becomes lower than reference potential VR and internal power supply potential VDDS is thereby lowered and the VDDS generation circuit cannot respond in not less than several nanoseconds since internal power supply potential VDDS becomes higher than reference potential VR and internal power supply potential VDDS thereby rises, are repeatedly carried out. Consequently, as shown in FIG. 32, internal potentials VDDS and VBL disadvantageously become unstable and ring.

Moreover, in DRAM, a negative potential VBB is applied to the back gates of N-channel MOS transistors of each memory cell so as to improve the refresh characteristic of the memory cell. However, a parasitic capacitance exists between a negative potential VBB line and an internal power supply potential VDDS line. Due to this, if internal power supply potential VDDS ring, negative power supply potential VBB ring, as well, with the result that the potential of the negative potential VBB line becomes positive and latch-up may possibly occur.

Furthermore, if P-channel MOS transistor 140 is made large in size to thereby improve the current supply capability, the ringing of internal power supply potential VDDS can be suppressed. However, gate capacitance C of P-channel MOS transistor 140 increases. It is, therefore, necessary to increase pass current Ib so as not to deteriorate response, with the result that a standby current, disadvantageously, greatly increases.

SUMMARY OF THE INVENTION

It is, therefore, a main object of the present invention to provide a semiconductor device capable of stably raising an internal power supply potential when an external power supply potential is applied and suppressing a standby current to be low.

A semiconductor device according to the present invention is provided with a first internal power supply potential generation circuit having a relatively low current driving force, and driven by an external power supply potential to generate an internal power supply potential; a second internal power supply potential generation circuit having a relatively high current driving force, activated in a predetermined period when the external power supply potential is applied and in the active mode, driven by the external power supply potential, and generating the internal power supply potential; and an internal circuit driven by the internal power supply potential. Since the second internal power supply potential generation circuit which has a relatively high current driving force is also activated when the external power supply potential is applied, it is possible to stably raise the internal power supply potential without increasing a standby current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
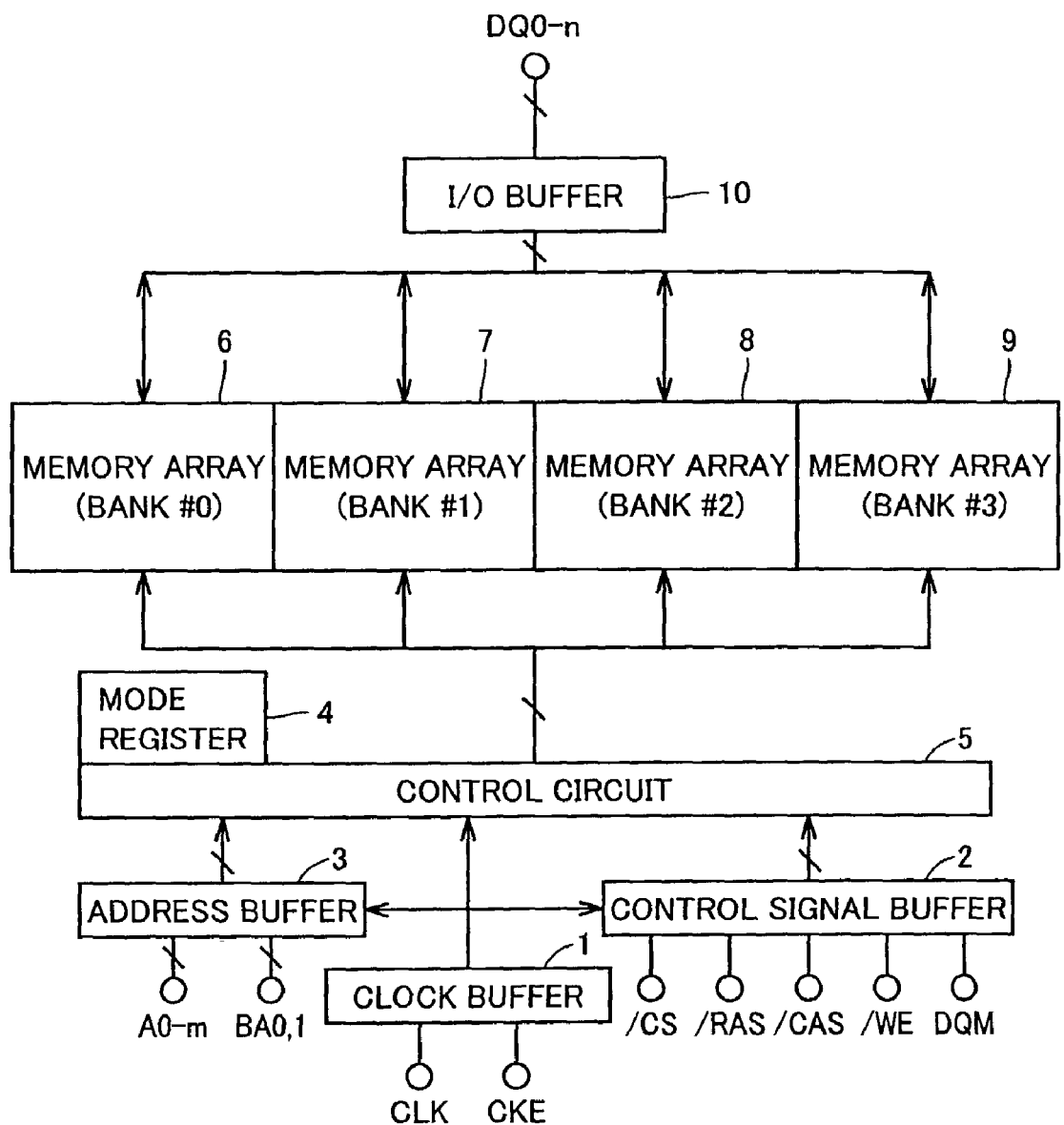
FIG. 1 is a block diagram showing the overall configuration of DRAM in the first embodiment according to the present invention.

FIG. 1 is a block diagram which shows the schematic configuration of a synchronous DRAM (referred to as "SDRAM" hereinafter) in the first embodiment according to the present invention. In FIG. 1, SDRAM includes a clock buffer 1, a control signal buffer 2, an address buffer 3, a mode register 4, a control circuit 5, four memory arrays 6 to 9 (banks #0 to #3) and an I/O buffer 10.

Clock buffer 1 is activated by an external control signal CKE, and transmits an external clock signal CLK to control signal buffer 2, address buffer 3 and control circuit 5. Control signal buffer 2 latches external control signals /CS, /RAS, /CAS, /WE and DQM synchronously with external clock signal CLK from clock buffer 1, and applies these control signals to control circuit 5. Address buffer 3 latches external address signals A0 to Am (where 0 is an integer not smaller than 0) and bank select signals BA0 and BA1 synchronously with external clock signal CLK from clock buffer 1, and applies these signals to control circuit 5.

Mode register 4 stores a mode indicated by external address signals A0 to Am or the like, and outputs an internal command signal according to the mode. Each of memory arrays 6 to 9 includes a plurality of memory cells arranged in a matrix. Each of memory cells stores data of one bit. A plurality of memory cells are grouped by (n+1) memory cells (where n is an integer not smaller than 0), respectively, in advance.

Control circuit 5 generates various internal signals in accordance with the signals applied from clock buffer 1, control signal buffer 2, address buffer 3 and mode register 4, and controls entire SDRAM. During a write operation and a read operation, control circuit 5 selects one of four memory arrays 6 to 9 in accordance with bank select signals BA0 and BA1, and selects (n+1) memory cells in the selected memory array in accordance with address signals A0 to Am. The selected (n+1) memory cells are activated and connected to I/O buffer 10.

During a write operation, I/O buffer 10 applies data signals D0 to Dn which are inputted from the outside of SDRAM to the selected (n+1) memory cells. During a read operation, I/O buffer 10 outputs read data signals Q0 to Qn from the selected (n+1) memory cells to the outside.

Figure 2:
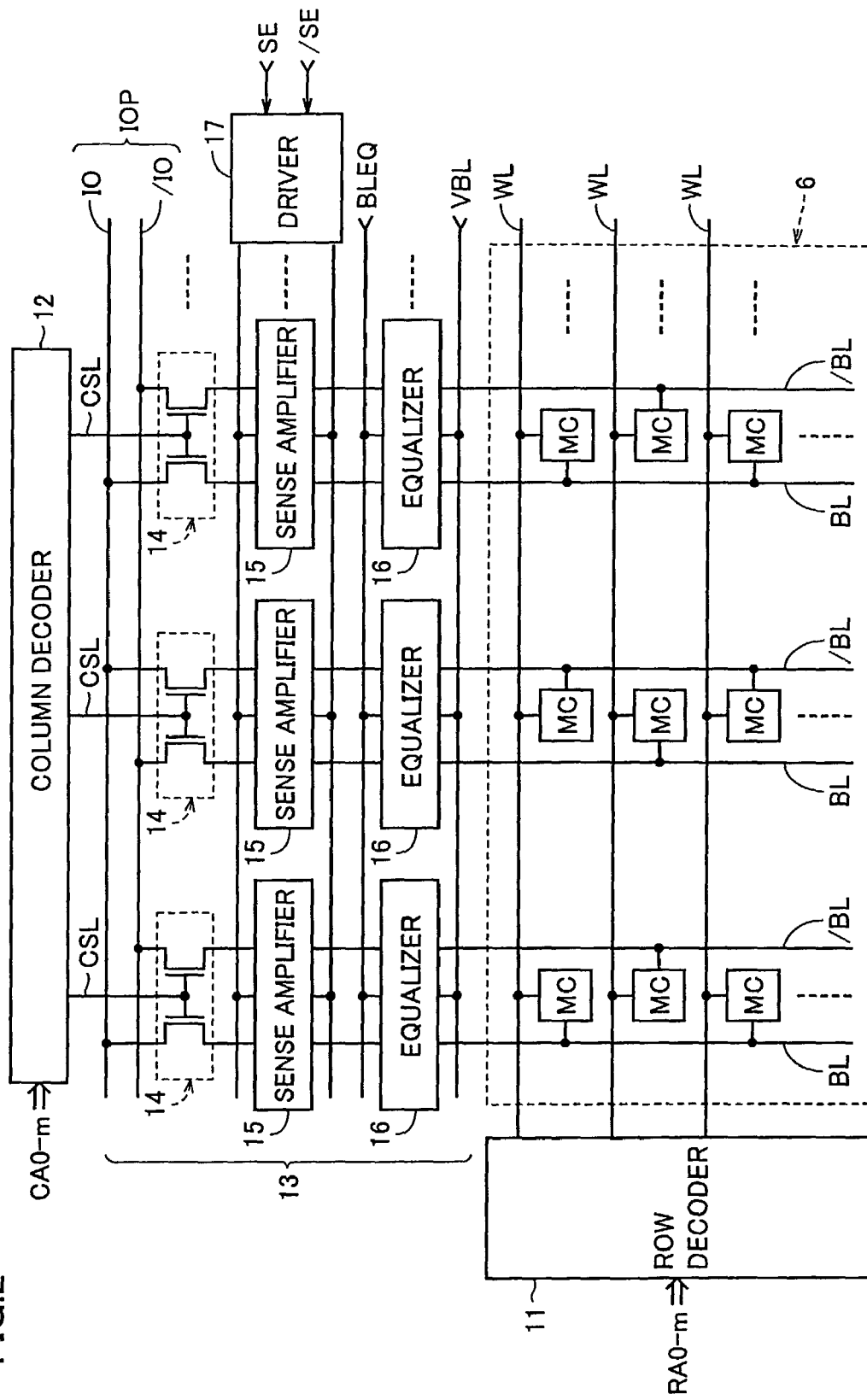
FIG. 2 is a circuit block diagram showing the configuration of a part of a memory array shown in FIG. 1 and those of sections related thereto.
Figure 3:
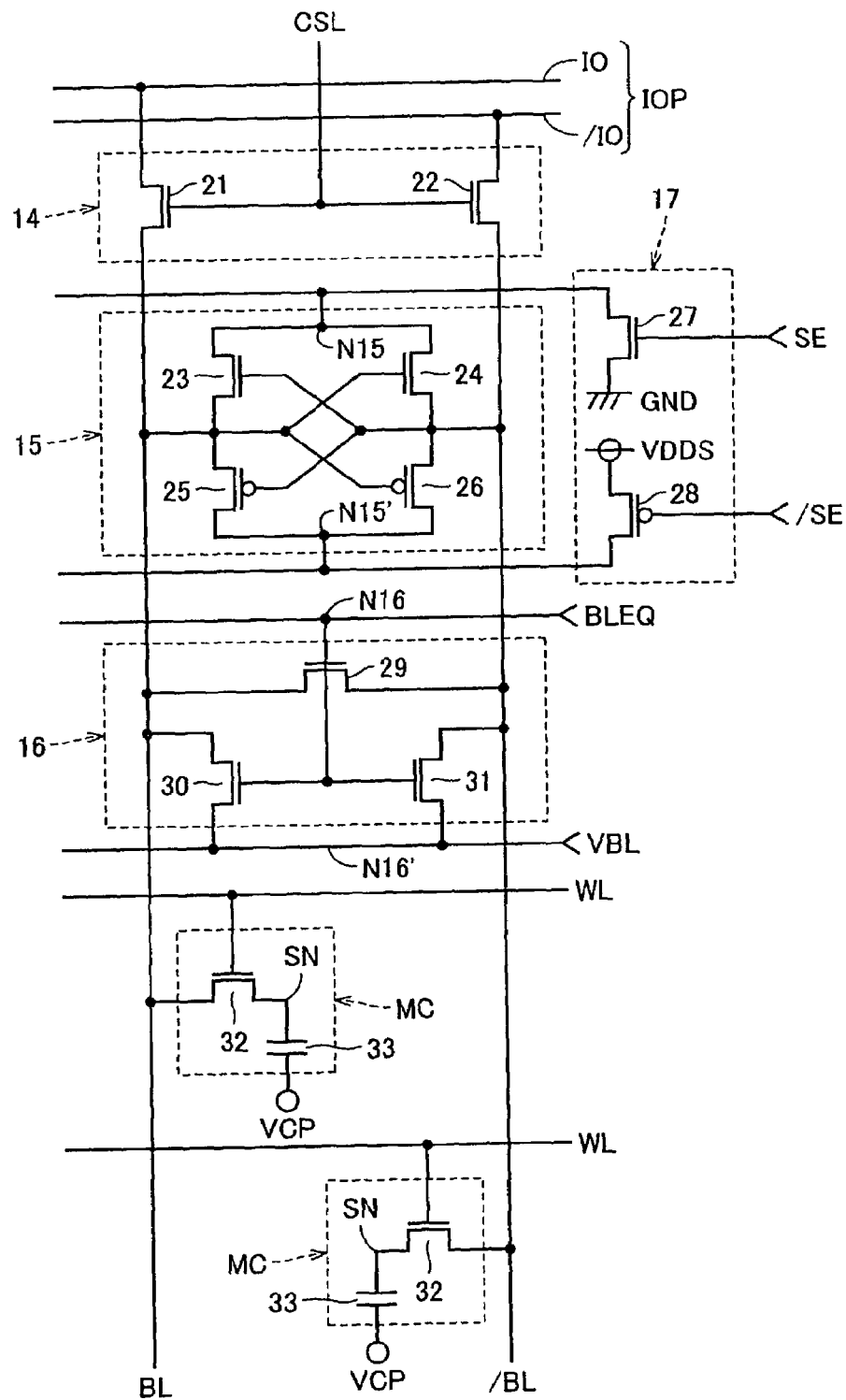
FIG. 3 is a circuit diagram showing the configurations of a sense amplifier+input/output control circuit and the memory array shown in FIG. 2 in more detail.

FIG. 2 is a circuit block diagram which shows the configuration of a part of memory array 6 shown in FIG. 1 and those of related sections thereto, and FIG. 3 is a circuit diagram which shows the configuration of one column shown in FIG. 2 in detail.

Referring to FIGS. 2 and 3, memory array 6 includes a plurality of memory cells MC which are arranged in a matrix, word lines WL which are provided to correspond to respective rows, and a plurality of bit line pairs BL and /BL which are provided to correspond to respective columns. Each memory cell MC includes an N-channel MOS transistor 32 for access and a capacitor 33 for storing information. The gate of N-channel MOS transistor 32 of each memory cell MC is connected to word line WL in the corresponding row. N-channel MOS transistor 32 is connected between bit line BL or /BL in the corresponding column and one electrode (storage node SN) of capacitor 33 of memory cell MC. The other electrode of capacitor 33 of each memory cell MC receives a cell plate potential VCP (=VDDS/2=0.75 V).

A row decoder 11, a column decoder 12 and a sense amplifier+input/output control circuit 13 are provided to correspond to memory array 6. Sense amplifier+input/output control circuit 13 includes a plurality of column select lines CSL, a plurality of column select gates 14, a plurality of sense amplifies 15 and a plurality of equalizers which are provided to correspond to the respective columns, a driver 17, and a data input/output line pair IO and /IO (IOP). Each column select gate 14 includes N-channel MOS transistors 21 and 22 which are connected between bit lines BL, /BL and data input/output lines IO, /IO, respectively. The gates of N-channel MOS transistors 21 and 22 are connected to column decoder 12 through column select line CSL. If column decoder 12 raises the level of column select line CSL to selected level of "H" level, N-channel MOS transistors 21 and 22 become conductive and bit line pair BL and /BL are connected to data input/output line pair IO and /IO, respectively.

Each sense amplifier 15 includes N-channel MOS transistors 23 and 24 which are connected between bit lines BL, /BL and node N15, respectively, and P-channel MOS transistors 25 and 26 which are connected between bit lines BL, /BL and a node N15', respectively. The gates of MOS transistors 23 and 25 are both connected to bit line /BL and those of MOS transistors 24 and 26 are both connected to bit line BL. Driver 17 includes an N-channel MOS transistor 27 which is connected between a node N15 and a ground potential GND line, and a P-channel MOS transistor 28 which is connected between node N15' and an internal power supply potential VDDS (1.5 V) line. The gates of MOS transistors 17 and 28 receive sense amplifier activation signals SA and /SA, respectively. If sense amplifier activation signals SA and /SA are set at "H" level and "L" level, respectively, then MOS transistors 27 and 28 become conductive, the potentials of nodes N15 and N15' become equal to ground potential GND and internal power supply potential VDDS, respectively, and sense amplifier 15 amplifies a minor potential difference between bit line pair BL and /BL to internal power supply voltage VDDS.

Equalizer 16 includes an N-channel MOS transistor 29 which is connected between bit lines BL and /BL, and N-channel MOS transistors 30 and 31 which are connected between bit lines BL, /BL and a node N16', respectively. The gates of N-channel MOS transistors 29 to 31 are all connected to a node N16. Node N16 receives a bit line equalization signal BLEQ, and node N16' receives bit line precharge potential VBL (=VDDS/2=0.75 V). If bit line equalization signal BLEQ is set at active level of "H" level, equalizer 16 equalizes the potentials of bit lines BL and /BL to bit line precharge potential VBL.

Figure 4:
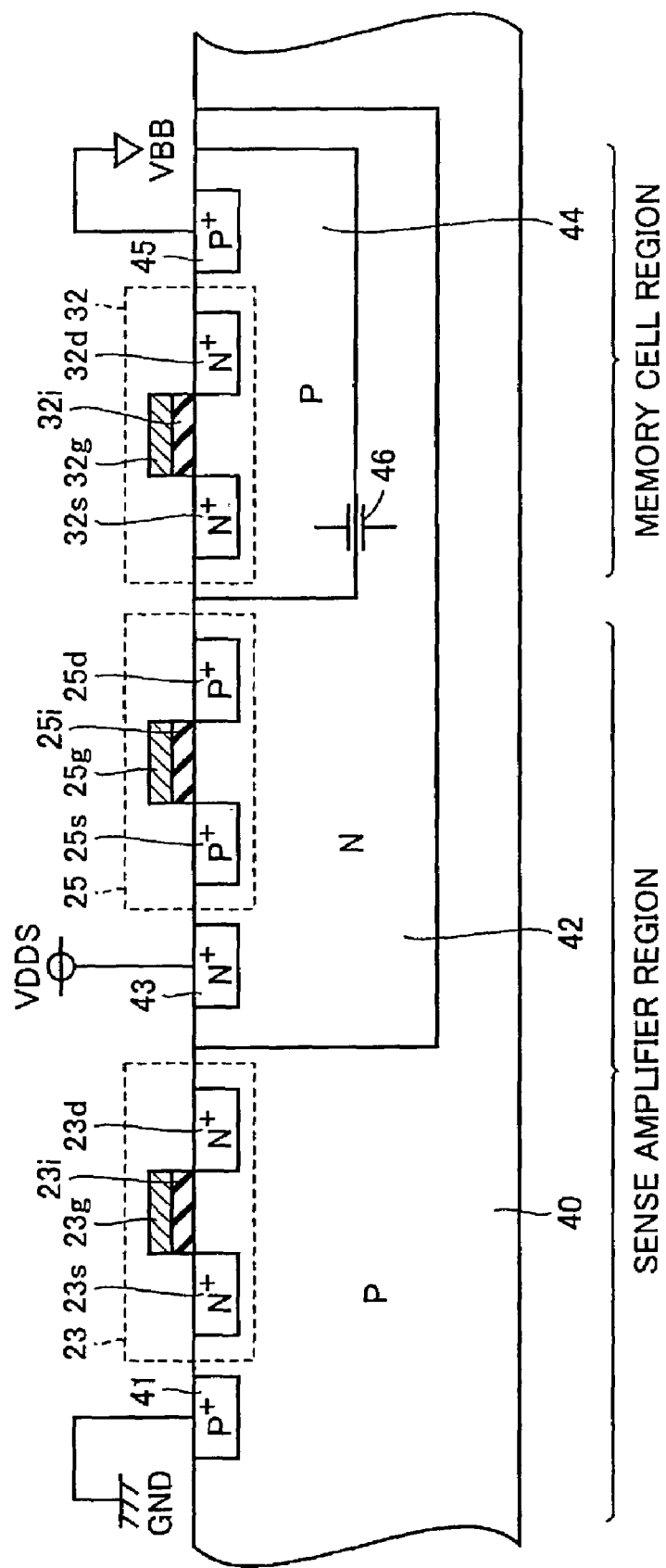
FIG. 4 is a cross-sectional view typically showing the configurations of the sense amplifier and a memory cell shown in FIG. 3.

FIG. 4 is a cross-sectional view which typically shows a region in which sense amplifier 15 and memory cell MC shown in FIG. 3 are arranged. In FIG. 4, a P+-type diffused layer 41, N-channel MOS transistor 23 and an N-type well 42 are formed on the surface of a P-type semiconductor substrate 40. N-channel MOS transistor 23 is constituted so that an N+-type diffused layer (source) 23s and an N+-type diffused layer (drain) 23d are formed on the surface of P-type semiconductor substrate 40 and that a gate oxide film 23i and a gate electrode 23g are layered on the surface of P-type semiconductor substrate 40 between N+-type diffused layers 23s and 23d.

An N+-type diffused layer 43, P-channel MOS transistor 25 and a P-type well 44 are formed on the surface of N-type well 42. P-channel MOS transistor 25 is constituted so that a P+-type diffused layer (source) 25s and a P+-type diffused layer (drain) 25d are formed on the surface of N-type well 42 and that a gate oxide film 25i and a gate electrode 25g are layered on the surface of N-type well 42 between P+-type diffused layers 25s and 25d. N-channel MOS transistor 32 and a P-type well 45 are formed on the surface of P-type well 44. N-channel MOS transistor 32 is constituted so that an N+-type diffused layer (source) 32a and an N+-type diffused layer (drain) 32d are formed on the surface of P-type well 44 and that a gate oxide film 32i and a gate electrode 32g are layered on the surface of P-type well 44 between N+-type diffused layers 32s and 32d.

P-type semiconductor substrate 40 receives ground potential GND through P+-type diffused layer 41, N-type well 42 receives internal power supply potential VDDS through N+-diffused layer 43, and P-type well 44 receives negative potential VBB (−1.0 V) through P+-type diffused layer 45. Therefore, a PN junction between P-type semiconductor substrate 40 and N-type well 42 is in a reverse bias state and that between P-type well 44 and N-type well 42 is in a reverse bias state. A parasitic capacitance 46 exists between N-type well 42 and P-type well 44.

Referring back to FIG. 2, row decoder 11 raises the level of one of a plurality of word lines WL to selected level of "H" level (boosted potential VPP=3.6 V) in accordance with row address signals RA0 to RAm. Column decoder 12 raises the level of one of a plurality of column select lines CSL to selected level of "H" level in accordance with column address signals CA0 to CAm.

Figure 5:
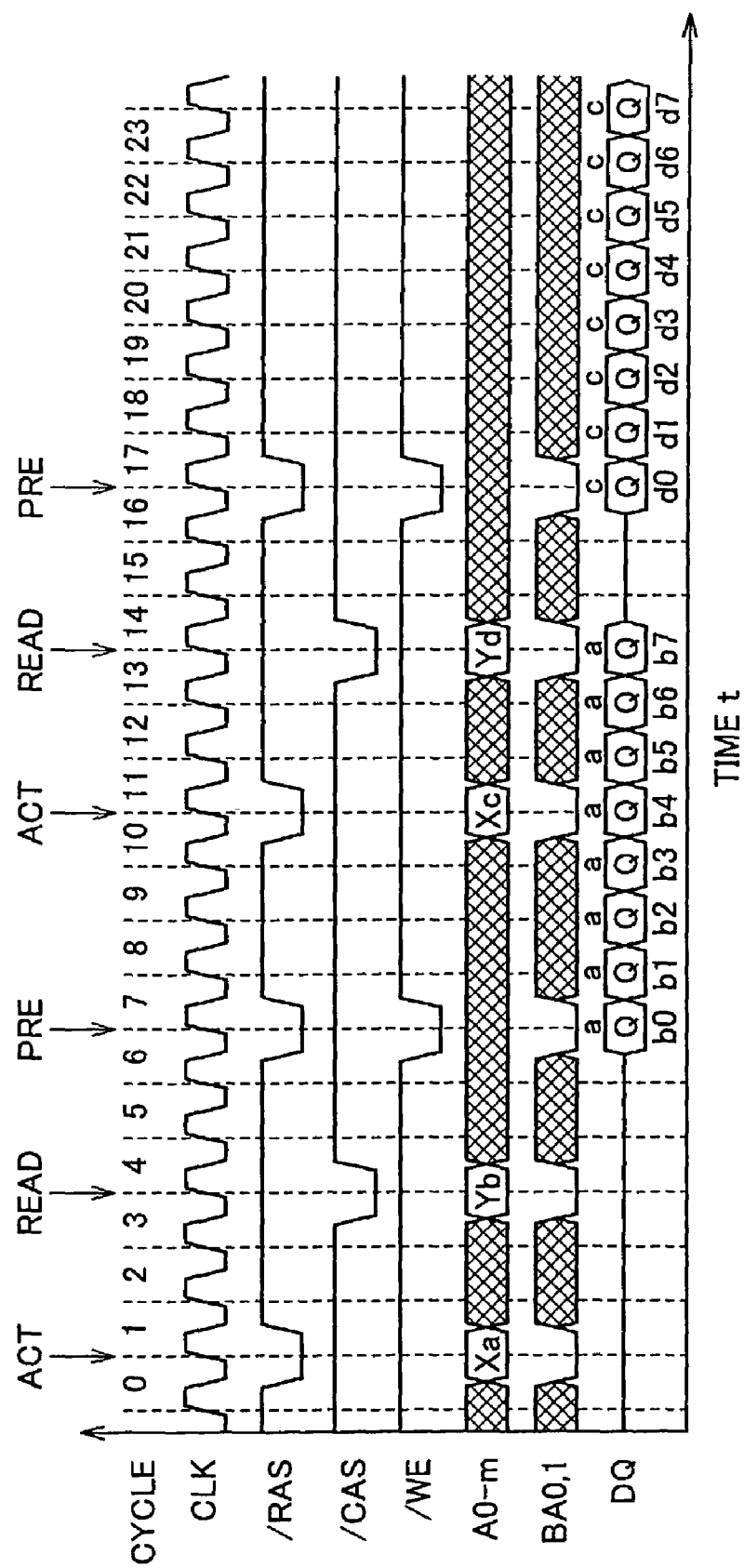
FIG. 5 is a time chart showing the read operation of an SDRAM shown in FIGS. 1 to 4.

FIG. 5 is a time chart showing the states of the external signals if an operation for continuously reading data of eight bits is carried out in such an SDRAM. It is noted that the number of bits of data read or written continuously is referred to as "burst length" which can be changed by mode register 4 in SDRAM.

In SDRAM, external control signals /CS, /RAS, . . . , address signals A0 to Am and the like are incorporated in response to the rising edge of external clock signal CLK. Address signals A0 to Am include row address signals X=RA0 to RAm and column address signals Y=CA0 to CAm which are time-division multiplexed. On the rising edge of clock signal CLK in a cycle 1, active command ACT (/CS=L, /RAS=L, /CAS=H and /WE=H) is inputted and address signals A0 to Am at that time are incorporated as a row address signal Xa.

Accordingly, the level of bit line equalization signal BLEQ is lowered to inactive level of "L" level first, and equalizers 16 are deactivated to stop equalizing bit lines BL and /BL. Row decoder 11 raises the level of word line WL in the row corresponding to row address signal Xa to selected level of "H" level (VPP). The potentials of bit lines BL and /BL change by a micro quantity in accordance with the charge quantities of capacitors 33 of activated memory cells MC. Next, sense amplifier activation signals SA and SA are set at "H" level and "L" level, respectively, thereby activating sense amplifiers 15.

If the potential of bit line BL is higher than that of bit line /BL by the micro quantity, the potential of bit line BL is raised to "H" level (VDDS) and that of bit line /BL is lowered to "L" level (GND). Conversely, if the potential of bit line /BL is higher than that of bit line BL by the micro quantity, the potential of bit line /BL is raised to "H" level (VDDS) and that of bit line BL is lowered to "L" level (GND).

Next, on the rising edge of clock signal CLK in a cycle 4, a read command READ (/CS=L, /RAS=H, /CAS=L and /WE=H) is applied and address signals A0 to Am at that time are incorporated as a column address signal Yb. Accordingly, column decoder 12 sequentially raises the levels of column select lines CSL by as much as the burst length, i.e., the levels of eight column select lines CSL to selected level of "H" level for predetermined time, respectively, based on column address signal Yb, thereby making column select gates 114 of the respective columns conductive. Data on bit line pairs BL and /BL in the selected columns are applied to I/O buffer 10 through column select gates 14 and data input/output line pairs IO and /IO. After a predetermined clock period (six clock cycles in FIG. 5) since the level of signal /RAS is lowered to "L" level, first data b0 is outputted from I/O buffer 10. Thereafter, data b1 to b7 are outputted in response to the rise of clock signal CLK.

Next, on the rising edge of clock signal CKL in a cycle 7, precharge command PRE (/CS=L, /RAS=L, /CAS=H and /WE=L) is applied. Accordingly, the level of word line WL is lowered to unselected level of "L" level, sense amplifiers 15 are deactivated, and equalizers 16 are activated to equalize bit lines BL and /BL to bit line precharge potential VBL, thus finishing preparation for the next read operation.

Figure 6:
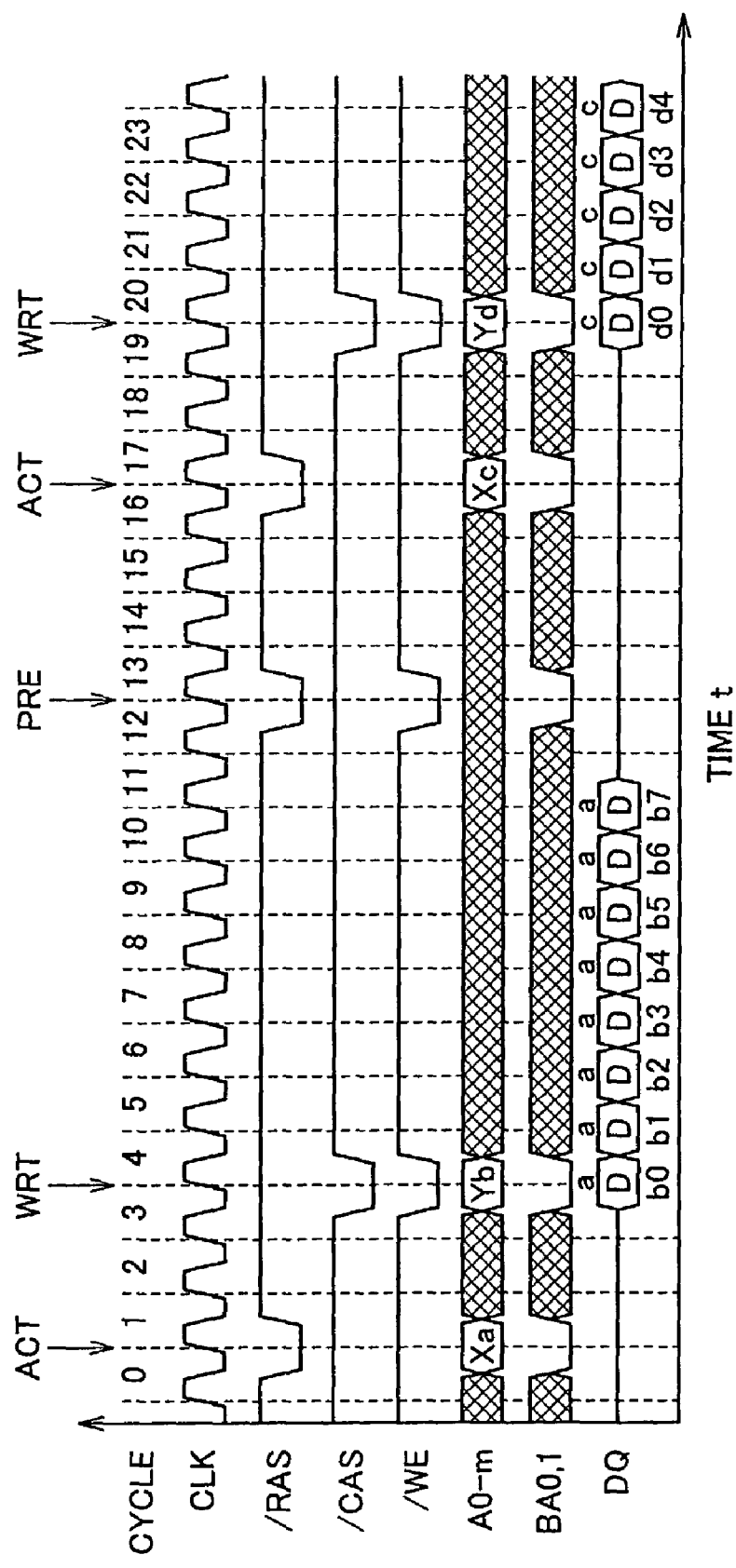
FIG. 6 is a time chart showing the write operation of SDRAM shown in FIGS. 1 to 4.

FIG. 6 is a time chart showing the states of the external signals if an operation for continuously writing data of eight bits is carried out in SDRAM. In a write operation, row address X is incorporated in the same manner as that in the read operation. Namely, on the rising edge of clock signal CLK in cycle 1, active command ACT (/CS=L, /RAS=L, /CAS=H and /WE=H) is inputted and address signals A0 to Am at that time are incorporated as a row address signal Xa. Accordingly, equalizers 16 are deactivated, and row decoder 11 raises the level of word line WL in accordance with row address signal Xa to selected level of "H" level, thereby activating memory cells MC and sense amplifiers 15. On the rising edge of clock signal in cycle 4, a command WRT (/CS=L, /RAS=H, /CAS=L and /WE=L) is inputted, column address signal Yb is incorporated and data b0 applied at that time is incorporated as the first data signal. Following data b0, input data b1 to b7 are sequentially incorporated synchronously with clock signal CLK.

Column decoder 12 sequentially raises the levels of eight column select lines CSL corresponding to the burst length to selected level of "H" level for predetermined time, respectively, based on column address signal Yb to thereby sequentially make column select gates 14 conductive. Write data b0 to b7 applied from the outside are sequentially applied to bit line pair BL and /BL in the selected columns through data input/output line pairs IO and /IO, respectively. Each write data is applied as the potential difference between bit lines BL and /BL. Charges in quantity corresponding to the potentials of bit lines BL or /BL are accumulated in capacitors 33 of selected memory cells MC, respectively.

If data b0 to b7 have been written, precharge command PRE (/CS=L, /RAS=L, /CAS=H and /WE=L) is inputted on the rising edge of clock signal CLK in a cycle 13. Accordingly, the level of word line WL is lowered to unselected level of "L" level, sense amplifiers 15 are deactivated, and equalizers 16 are activated to equalize the potentials of bit lines BL and /BL to bit line precharge potential VBL, thus finishing preparation for the next write operation.

Figure 7:
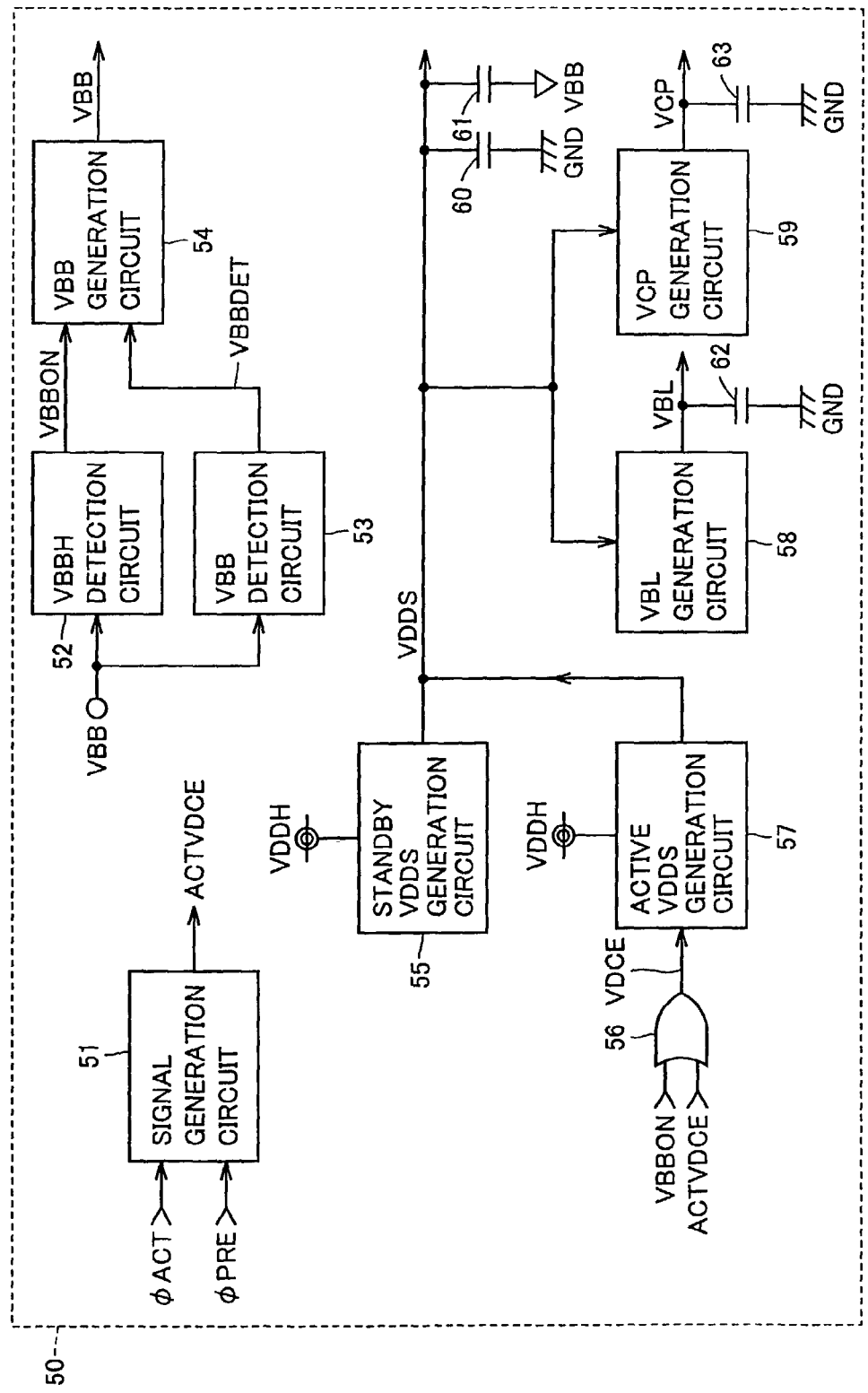
FIG. 7 is a circuit block diagram showing the configuration of an internal potential generation circuit included in SDRAM shown in FIGS. 1 to 6.

An internal potential generation circuit 50, which is characteristic of SDRAM in this embodiment, will now be described. As shown in FIG. 7, internal potential generation circuit 50 includes a signal generation circuit 51, a VBBH detection circuit 52, a VBB detection circuit 53, and a VBB generation circuit 54. Signal generation circuit 51 raises the level of signal ACTVDCE to inactive level, "L" level, in response to the rise of the level of signal φACT to the active level, "H" level, and lowers the level of signal ACTVDCE to the active level, "H" level, in response to the rise of the level of signal φPRE to the active level, "H" level. The level of signal φACT is raised to the active level, "H" level, in response to the active command ACT, and the level of signal φPRE is raised to the active level, "H" level, in response to precharge command PRE. Therefore, signal ACTVDCE is set at "H" level after active command ACT is input and until precharge command PRE is input.

Figure 8:
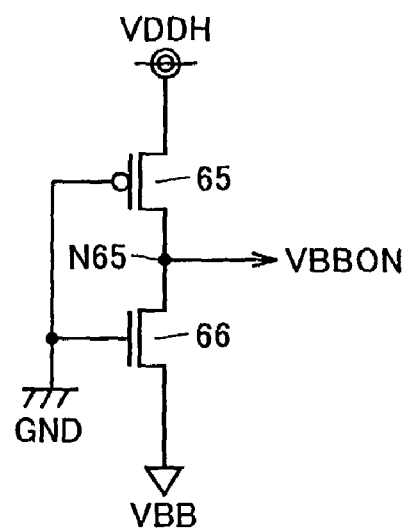
FIG. 8 is a circuit diagram showing the configuration of a VBBH detection circuit shown in FIG. 7.

VBBH detection circuit 52 is a circuit which detects the negative potential VBB reaches −0.5V when a voltage is applied. That is, as shown in FIG. 8, VBBH detection circuit 52 includes a P-channel MOS transistor 65 and an N-channel MOS transistor 66 which are connected in series between an external power supply potential VDDH line and a negative potential VBB line. The gates of MOS transistors 65 and 66 are connected to a ground potential GND line. P-channel MOS transistor 65 constitutes a resistance element. A signal which appears at a node N65 between MOS transistors 65 and 66 becomes an output signal VBBON of VBBH detection circuit 52.

If negative potential VBB is higher than −Vth (where Vth is the threshold voltage of N-channel MOS transistor 66 and 0.5 V), N-channel MOS transistor 66 becomes nonconductive and the level of signal VBBON becomes "H" level (VDDH). If negative potential VBB reaches −Vth, N-channel MOS transistor 66 becomes conductive and the level of signal VBBON becomes "L" level (GND).

Figure 9:
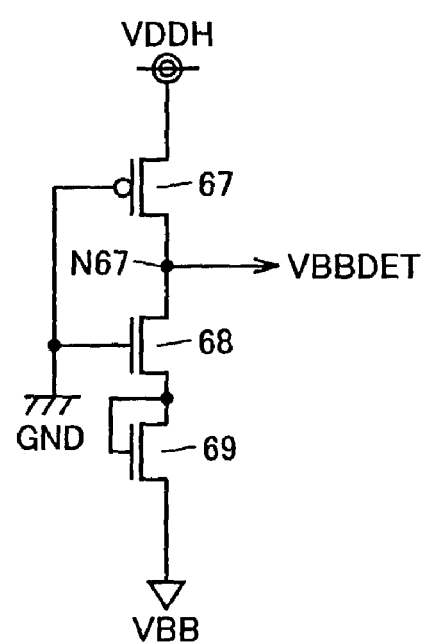
FIG. 9 is a circuit diagram showing the configuration of a VBB detection circuit shown in FIG. 7.

VBB detection circuit 53 is a circuit which detects whether or not negative potential VBB is −1.0 V in a normal operation. That is, as shown in FIG. 9, VBB detection circuit 53 includes a P-channel MOS transistor 67 and N-channel MOS transistors 68 and 69 which are connected in series between an external power supply potential VDDH line and a negative potential VBB line. The gates of MOS transistors 67 and 68 are connected to a ground potential GND line. The gate of N-channel MOS transistor 69 is connected to the drain thereof. P-channel MOS transistor 67 constitutes a resistance element and N-channel MOS transistor 69 constitutes a diode element. A signal which appears at a node N67 between MOS transistors 67 and 68 becomes the output signal VBBDET of VBB detection circuit 53.

If negative voltage VBB is higher than −2 Vth, i.e., −1.0 V, N-channel MOS transistor 68 becomes nonconductive and the level of signal VBBDET becomes "H" level (VDDH). If negative potential VBB reaches −2 Vth, N-channel MOS transistor 68 becomes conductive and the level of signal VBBDET becomes "L" level (GND). VBB generation circuit 54 is driven by external power supply voltage VDDH, emits positive charges from the negative potential VBB line with relatively high charge emission capability if signals VBBON and VBBDET are both at "H" level, emits positive charges from the negative potential VBB line with relatively low charge emission capability if signals VBBON and VBBDET are at "L" level and "H" level, respectively, and stops emitting positive charges if signals VBBON and VBBDET are both at "L" level.

Figure 29:
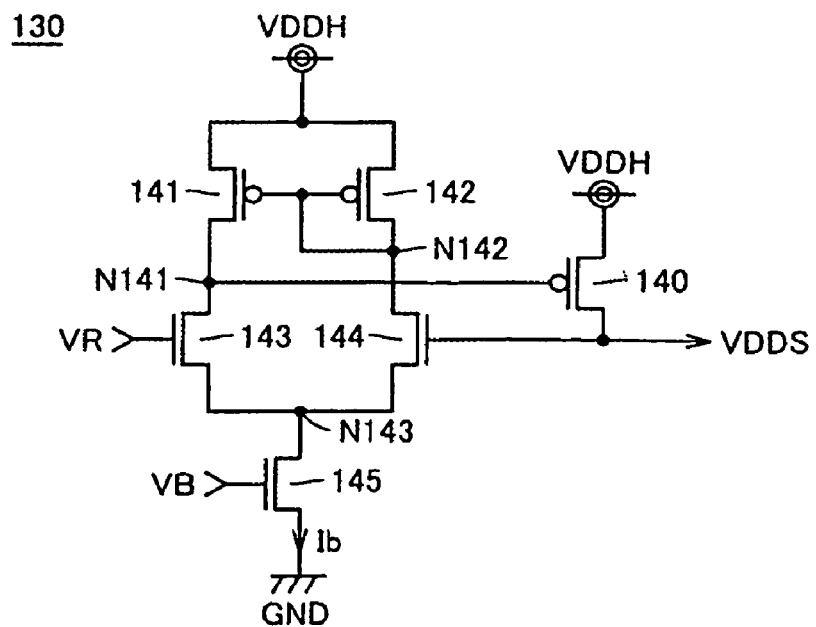
FIG. 29 is a circuit diagram showing the configuration of a standby VDDS generation circuit included in a conventional DRAM.
Figure 30:
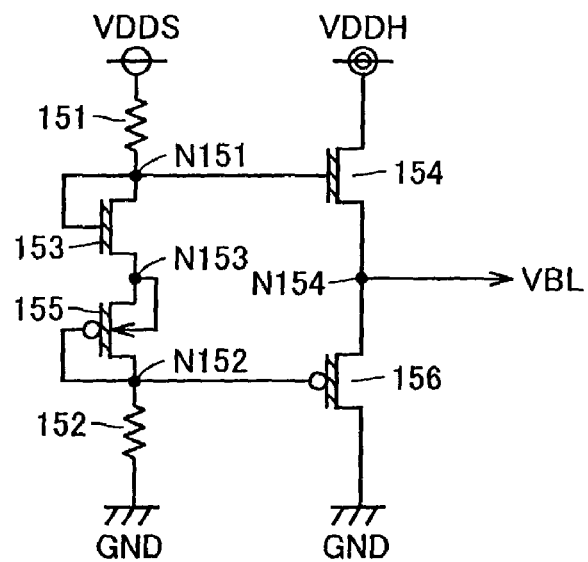
FIG. 30 is a circuit diagram showing the configuration of a VBL generation circuit included in the conventional DRAM.

Internal potential generation circuit 50 also includes a standby VDDS generation circuit 55, an OR gate 56, an active VDDS generation circuit 57, a VBL generation circuit 58 and a VCP generation circuit 59. Standby VDDS generation circuit 55 is equal in configuration to conventional standby VDDS generation circuit 130 shown in FIG. 29 and has a relatively low current driving force. Standby VDDS generation circuit 55 supplies a current to an internal power supply potential VDDS line when external power supply potential VDDH is applied to circuit 55.

OR gate 56 receives signals VBBON and ACTVDCE and outputs a signal VDCE. Therefore, signal VDCE is set at the active level, "H" level, in both a period following application of external power supply potential VDDH until negative potential VBB reaches −0.5 V and a period (active period) following application of active command ACT until precharge command PRE is applied. It is noted that all periods other than the active period are standby periods.

Active VDDS generation circuit 57 has a relatively current driving force, is activated while signal VDCE is at "H" level and supplies a current to the internal power supply potential VDDS line to make internal power supply potential VDDS equal to reference potential VR. Since it is necessary to supply a peak current of approximately 100 mA if a current is consumed while sense amplifier 15 operates, active VDDS generation circuit 57 has high current driving capability and high response. To obtain high response, a pass current Ia of approximately 10 to 20 mA is carried to circuit 57 in an active state.

Figure 10:
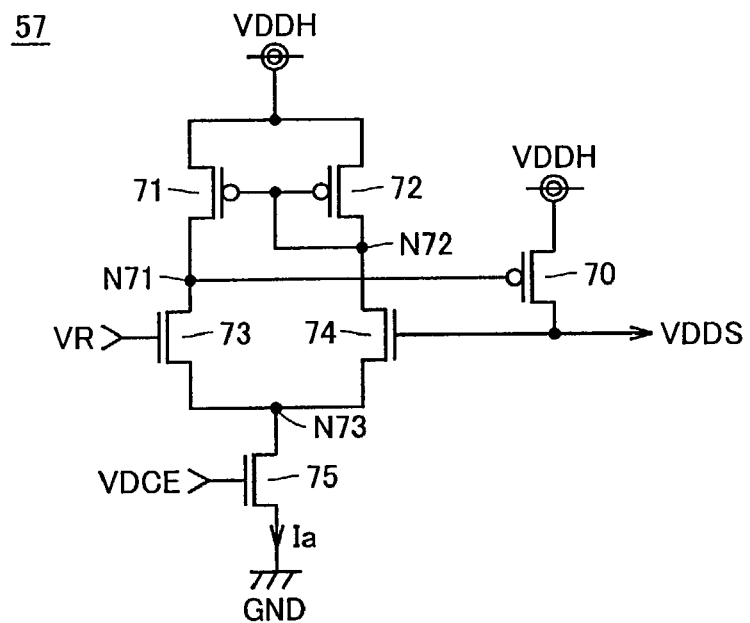
FIG. 10 is a circuit diagram showing the configuration of an active VDDS generation circuit shown in FIG. 7.

Namely, as shown in FIG. 10, active VDDS generation circuit 57 includes P-channel MOS transistors 70 to 72 and N-channel MOS transistors 73 to 75. MOS transistors 70 to 75 are higher in current driving force than MOS transistors 140 to 145 shown in FIG. 29. P-channel MOS transistors 71 and 72 are connected between an external power supply potential VDDH line and nodes N71, N72, respectively, and the gates thereof are connected to node N72. P-channel MOS transistors 71 and 72 constitute a current mirror circuit. N-channel MOS transistors 73 and 74 are connected between nodes N71, N72 and a node N73, respectively, and the gates thereof receives reference potential VR (1.5 V) and internal power supply potential VDDS, respectively. N-channel MOS transistor 75 is connected between node N73 and a ground potential GND line, and the gate thereof receives signal VDCE. MOS transistors 71 to 75 constitute a differential amplifier. P-channel MOS transistor 70 is connected between the external power supply potential VDDH line and the internal power supply potential VDDS line, and the gate thereof is connected to node N71.

If signal VDCE is at "L" level, then N-channel MOS transistor 75 becomes nonconductive, the level of node N71 becomes "H" level and P-channel MOS transistor 70 becomes nonconductive. If signal VDCE is at "H" level, N-channel MOS transistor 75 becomes conductive and the differential amplifier is activated. If internal power supply potential VDDS is lower than reference potential VR, then a current which flows in P-channel MOS transistor 71 becomes lower than a current which flows in N-channel MOS transistor 73, the level of N71 is lowered to "L" level and P-channel MOS transistor 70 becomes conductive. As a result, a current is supplied from the external power supply potential VDDH line to the internal power supply potential VDDS line through P-channel MOS transistor 20, thereby raising internal power supply potential VDDS. If internal power supply potential VDDS is higher than reference potential VR, then the current which flows in P-channel MOS transistor 71 becomes higher than the current which flows in N-channel MOS transistor 73, the level of N71 is raised to "H" level and P-channel MOS transistor 70 becomes nonconductive. If internal power supply potential VDDS is consumed, internal power supply potential VDDS is lowered. Therefore, internal power supply potential VDDS is kept to be equal to reference potential VR.

Figure 31:
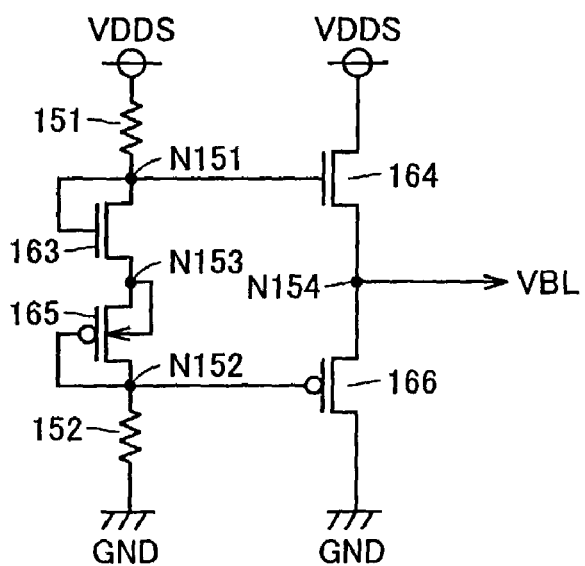
FIG. 31 is a circuit diagram showing the configuration of the other conventional VBL generation circuit.
Figure 32:
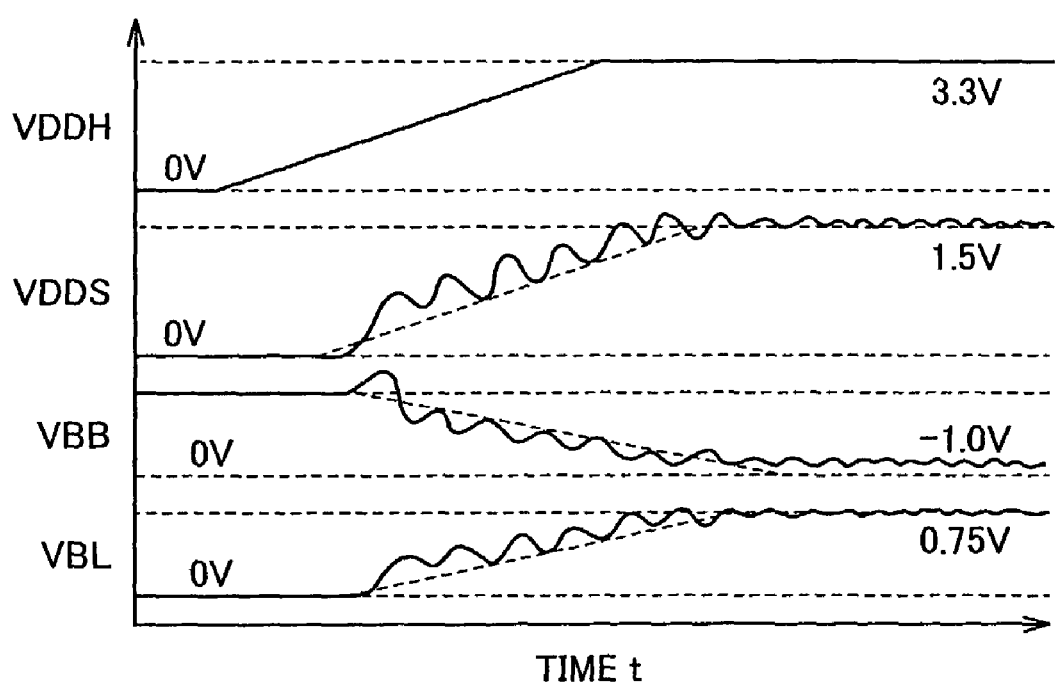
FIG. 32 is a time chart for explaining the disadvantages of conventional DRAM.

Referring back to FIG. 7, a load capacitance 60 is connected between the internal power supply potential VDDS line and the ground potential GND line, and a load capacitance 61 is connected between the internal power supply potential VDDS line and the negative potential VBB line. VBL generation circuit 58 is driven by internal power supply potential VDDS and generates bit line precharge potential VBL. A load capacitance 62 is connected between a bit line precharge potential VBL line and the ground potential GND line. VCP generation circuit 59 is driven by internal power supply potential VDDS and generates cell plate potential VCP. A load capacitance 63 is connected between a cell plate potential VCP line and the ground potential GND line. VBL generation circuit 58 and VCP generation circuit 59 are equal in configuration to VBL generation circuit 60 shown in FIG. 31. Although a circuit which generates boosted potential VPP is also provided in internal potential generation circuit 50, it is not shown in the drawing and not described herein.

Figure 11:
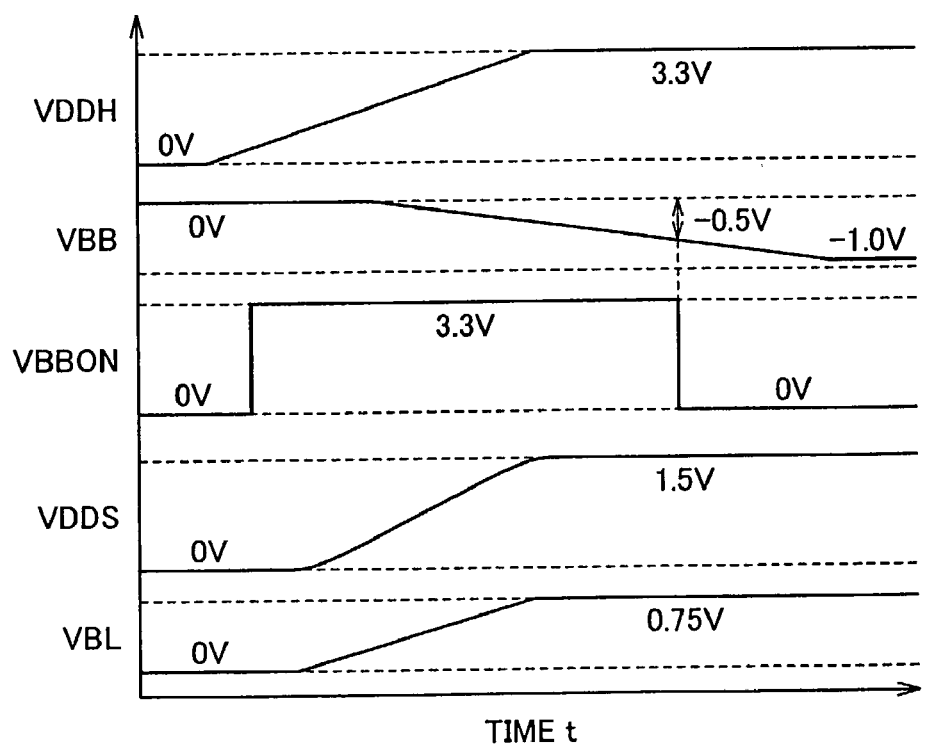
FIG. 11 is a time chart showing the operations of the internal potential generation circuit shown in FIGS. 7 to 10.

FIG. 11 is a time chart showing the operations of internal potential generation circuit 50 shown in FIGS. 7 to 10. In an initial state, external power supply potential VDDH is set at 0 V and internal potentials VBB, VDDS and VBL and signal VBBON are also set at 0 V. If external power supply potential VDD is applied at certain time, then the level of signal VBBON is raised from "L" level to "H" level and VBB generation circuit 54, standby VDDS generation circuit 55, active VDDS generation circuit 57, VBL generation circuit 58 and VCP generation circuit 59 are activated. As a result, negative potential VBB gradually lowers and internal power supply potential VDDS and bit line precharge potential VBL gradually rise. At this moment, active VDDS generation circuit 57, which is high in charge supply capability and response, is activated, so that internal power supply potential VDDS does not rock unlike the conventional art.

When negative potential VBB reaches −0.5 V, the level of signal VBBON is lowered from "H" level to "L" level and active VDDS generation circuit 57 is deactivated. Following this, active VDDS generation circuit 57 is activated only when internal power supply potential VDDS is greatly consumed, i.e., only during a period after active command ACT is input and until precharge command PRE is input.

In this first embodiment, active VDDS generation circuit 57 is activated when a voltage is applied. Due to this, unlike the conventional art, internal power supply potential VDDS does not greatly change or ring, making it possible to stably raise internal power supply potential VDDS. Therefore, negative potential VBB which is connected to internal power supply potential VDDS through parasitic capacitance 46 does not greatly change and no latch-up occurs. Further, since there is no need to improve the response of standby VDDS generation circuit 55, standby current does not increase.

Figure 12:
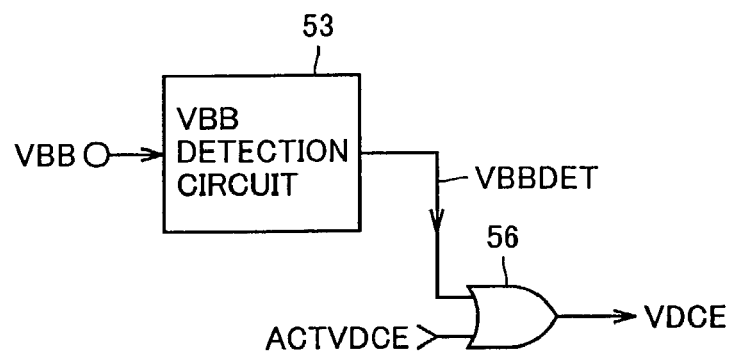
FIG. 12 is a circuit block diagram showing a modification of the first embodiment.

As shown in FIG. 12, output signal VBBDET of VBB detection circuit 53 instead of output signal VBBON of VBBH detection circuit 52 may be inputted into OR gate 56. In this case, active VDDS generation circuit 57 is kept active until negative potential VBB reaches −1.0 V. Therefore, time for which active VDDS generation circuit 57 is activated when a voltage is applied becomes long.

Second Embodiment

Figure 13:
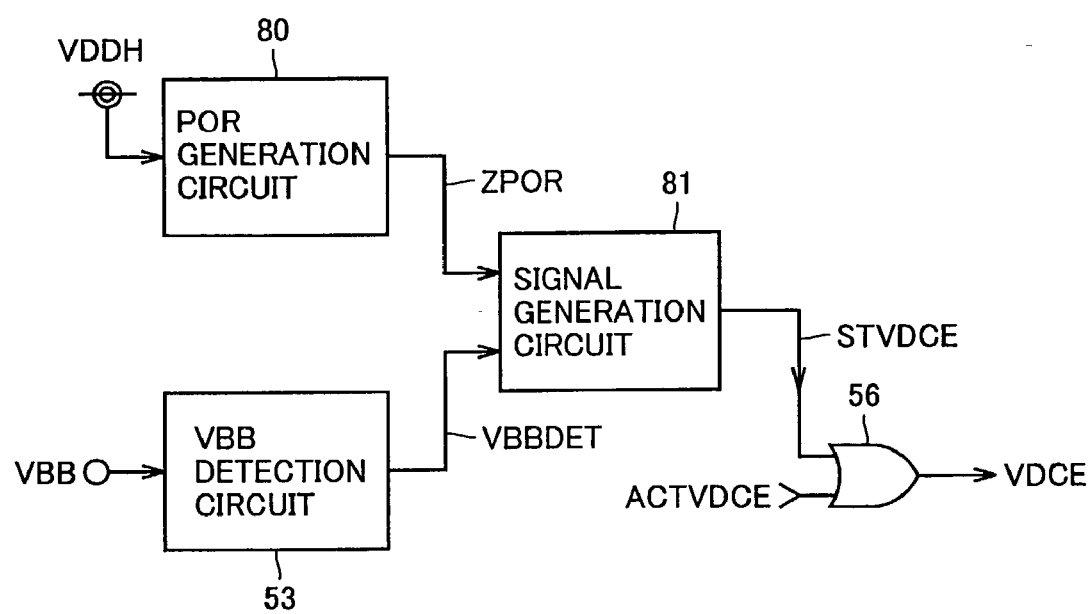
FIG. 13 is a circuit block diagram showing the important parts of an internal potential generation circuit of an SDRAM in the second embodiment according to the present invention.

FIG. 13 is a circuit block diagram which shows the important parts of the internal potential generation circuit of SDRAM in the second embodiment according to the present invention. Referring to FIG. 13, this internal potential generation circuit differs from that shown in FIG. 12 in that a POR generation circuit 80 and a signal generation circuit 81 are added.

Figure 14:
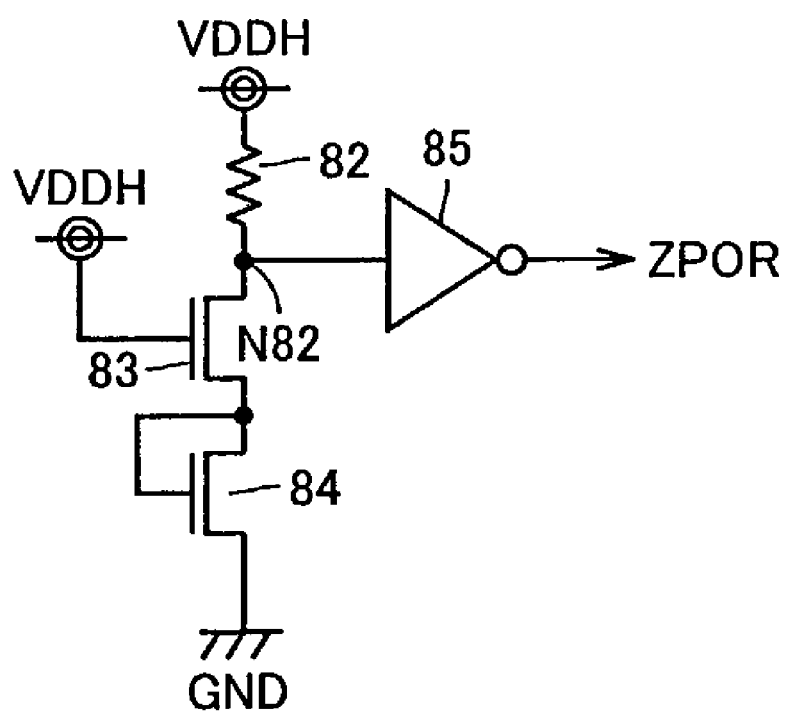
FIG. 14 is a circuit diagram showing the configuration of a POR generation circuit shown in FIG. 13.

As shown in FIG. 14, POR generation circuit 80 includes a resistance element 82 and N-channel MOS transistors 83 and 84 which are connected in series between an external power supply potential VDDH line and a ground potential GND line, and an inverter 85. The gate of N-channel MOS transistor 83 receives external power supply potential VDDH. The gate of N-channel MOS transistor 84 is connected to the drain thereof. N-channel MOS transistor 84 constitutes a diode element. A signal which appears at a node N82 between resistance element 82 and N-channel MOS transistor 83 is inverted by inverter 85 and become a power-on reset signal ZPOR.

If external power supply potential VDDH is lower than 2 Vth, then N-channel MOS transistors 83 and 84 become nonconductive, the level of node N82 become "H" level and that of power-on reset signal ZPOR become active level of "L" level. If external power supply potential VDDH is higher than 2 Vth, then N-channel MOS transistors 83 and 84 become conductive, the level of node N82 become "L" level and that of power-on reset signal ZPOR become inactive level of "H" level.

Figure 15:
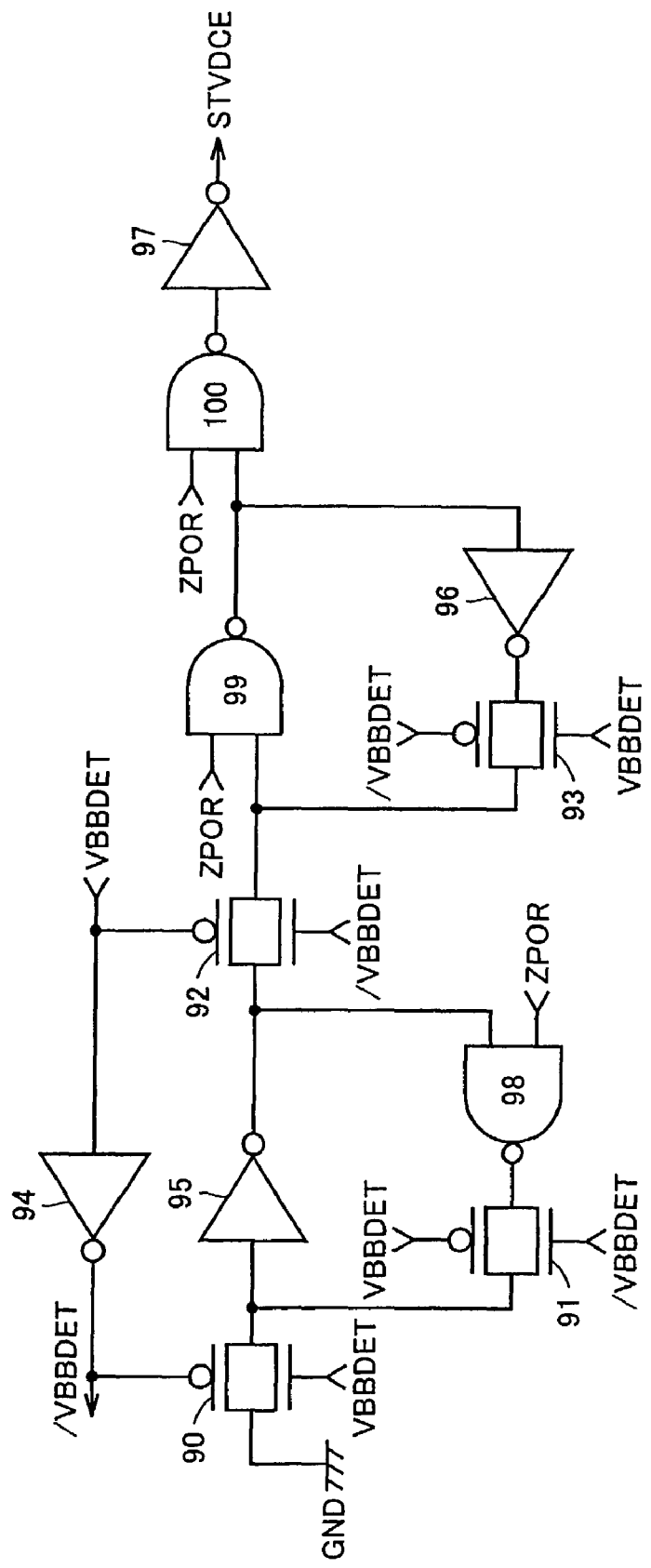
FIG. 15 is a circuit diagram showing the configuration of a signal generation circuit shown in FIG. 13.

Signal generation circuit 81 is a circuit which raises the level of a signal STVDCE to "H" level when power-on reset signal ZPOR is set at "H" level lowers that of signal STVDCE to "L" level when signal VBBDET is set at "L" level. Namely, as shown in FIG. 15, signal generation circuit 81 includes transfer gates 90 to 93, inverters 94 to 97 and NAND gates 98 to 100. Signal ZPOR is inputted into one of the input nodes of each of NAND gates 98 to 100. Signal VBBDET is inputted into the N-channel MOS transistor-side gate of each of transfer gates 90 and 93 and the P-channel MOS transistor-side gate of each of transfer gates 91 ad 92, and inverted by inverter 94 to a signal /VBBDET. Signal /VBBDET is inputted into the P-channel MOS transistor-side gate of each of transfer gates 90 and 93 and the N-channel MOS transistor-side gate of each of transfer gates 91 and 92.

Transfer gate 90, inverter 95 and transfer gate 92 are connected in series between a ground potential GND line and the other input node of NAND gate 99. The output signal of inverter 95 is inputted into the other input node of NAND gate 98, and the output signal of NAND gate 98 is inputted into inverter 95 through transfer gate 91. The output signal of NAND gate 99 is inputted into the other input node of NAND gate 100 and inputted into the other input node of NAND gate 99 through inverter 96 and transfer gate 93. The output signal of NAND gate 100 is inverted by inverter 97 to signal STVDCE.

If signals ZPOR and VBBDET are both at "L" level, then the output signals of NAND gates 98 to 100 are all set at "H" level, transfer gates 91 and 92 become conductive, transfer gate 90 and 93 become nonconductive, output signals of inverters 95 to 97 are all set at "L" level and signal STVDCE is set at "L" level. At this moment, the output signal of inverter 95 is latched by inverter 95 and NAND gate 98.

Next, if the level of signal ZPOR is raised to "H" level, then that of the output signal of NAND gate 100 becomes "L" level and that of signal STVDE is raised to "H" level. If the level of signal VBBDET is next raised to "H" level, then transfer gates 90 and 93 become conductive, transfer gates 91 and 92 become nonconductive, and the output signals of inverter 95 and NAND gate 98 are set at "H" level and "L" level, respectively. At this time, the output signal of NAND gate 99 is latched by NAND gate 99 and inverter 96. Next, if the level of signal VBBDET is lowered to "L" level, then transfer gates 91 and 92 become conductive, transfer gates 90 and 93 become nonconductive, the level of the output signal of NAND gate 99 becomes "L" level and that of signal STVDCE become "L" level. Thereafter, even if the level of signal VBBDET becomes "H" level, that of the output signal of NAND gate 99 remains "H" level and that of signal STVDCE remains "L" level. Referring back to FIG. 13, signal STVDCE is inputted into OR gate 56 in place of signal VBBDET.

Figure 16:
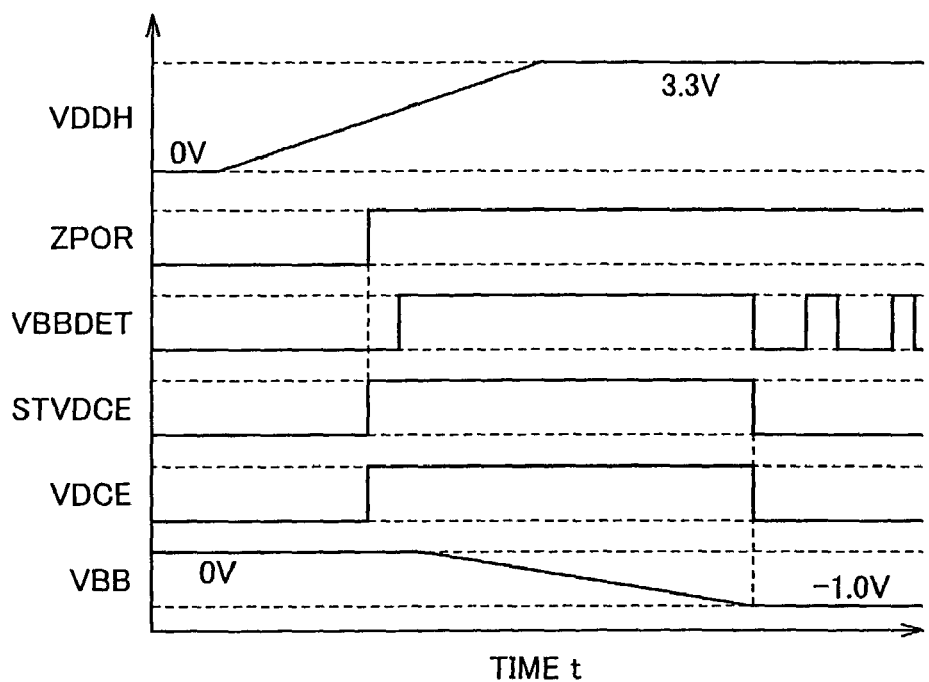
FIG. 16 is a time chart showing the operations of the internal potential generation circuit shown in FIGS. 13 to 15.

FIG. 16 is a time chart showing the operations of the internal potential generation circuit shown in FIGS. 13 to 15. In an initial state, external power supply potential VDDH is set at 0 V, signals ZPOR, VBBDET, STVDCE and VDCE are all set at "L" level and negative potential VBB is also set at "L" level.

When a predetermined time passes after application of external power supply potential VDDH, then the level of signal ZPOR is raised to "H" level, the levels of signals STVDCE and VDCE are raised to "H" level and active VDDS generation circuit 57 is activated. Next, the level of signal VBBDET is raised to "H" level, VBB generation circuit 54 is activated and negative potential VBB gradually lowers. When negative potential VBB reaches −1.0 V, then the level of signal VBBDET is lowered to "L" level, the levels of signals STVDCE and VDCE become "L" level and active VDDS generation circuit 57 is deactivated. Thereafter, even if the level of signal VBBDET changes according to the detection result of negative potential VBB, the level of signal STVDCE remains "L" level.

In this second embodiment, active VDDS generation circuit 57 is also activated during a period after the level of signal ZPOR is raised to "H" level and until negative potential VBB reaches −1.0 V. Therefore, the second embodiment can attain the same advantages as those of the first embodiment.

Third Embodiment

Figure 17:
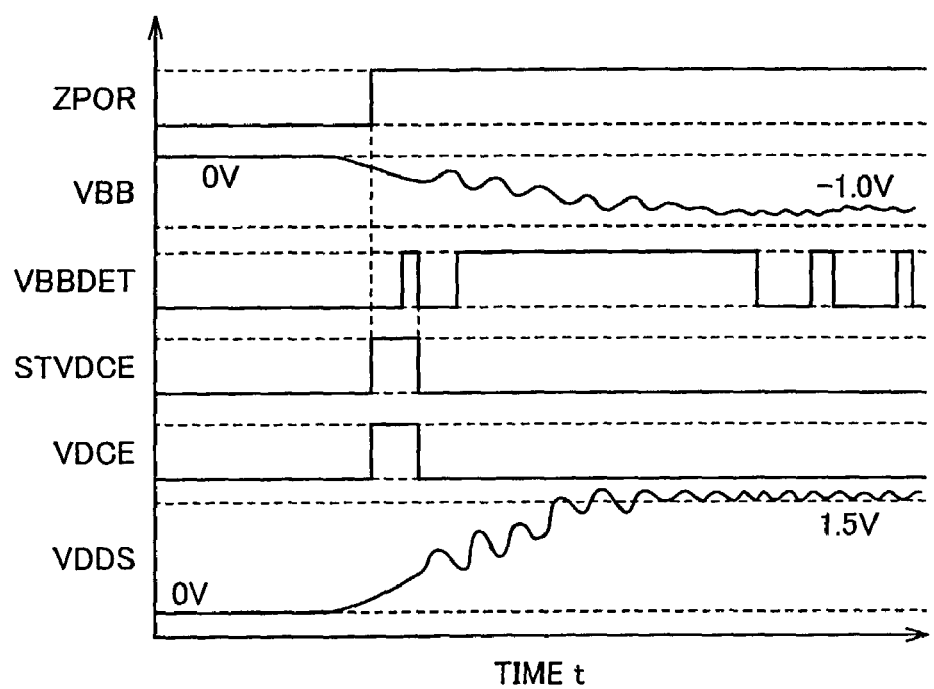
FIG. 17 is a time chart for explaining the disadvantages of the second embodiment.

Signal generation circuit 81 in the second embodiment is a circuit which sets signal SDVCE at "H" level only during a period after the level of signal ZPOR is raised to "H" level and extending until signal VBBDET is lowered to "L" level. Therefore, as shown in FIG. 17, if the operation of VBB detection circuit 53 becomes unstable and signal VBBDET rings between "H" level and "L" level, then the period in which signals STVDCE and VCDCE are at "H" level becomes short, so that the time period in which active VDDS generation circuit 57 is activated becomes short and internal power supply potential VDDS and negative potential VBB change greatly, as in the case of the conventional art. The third embodiment is intended to solve these disadvantages.

Figure 18:
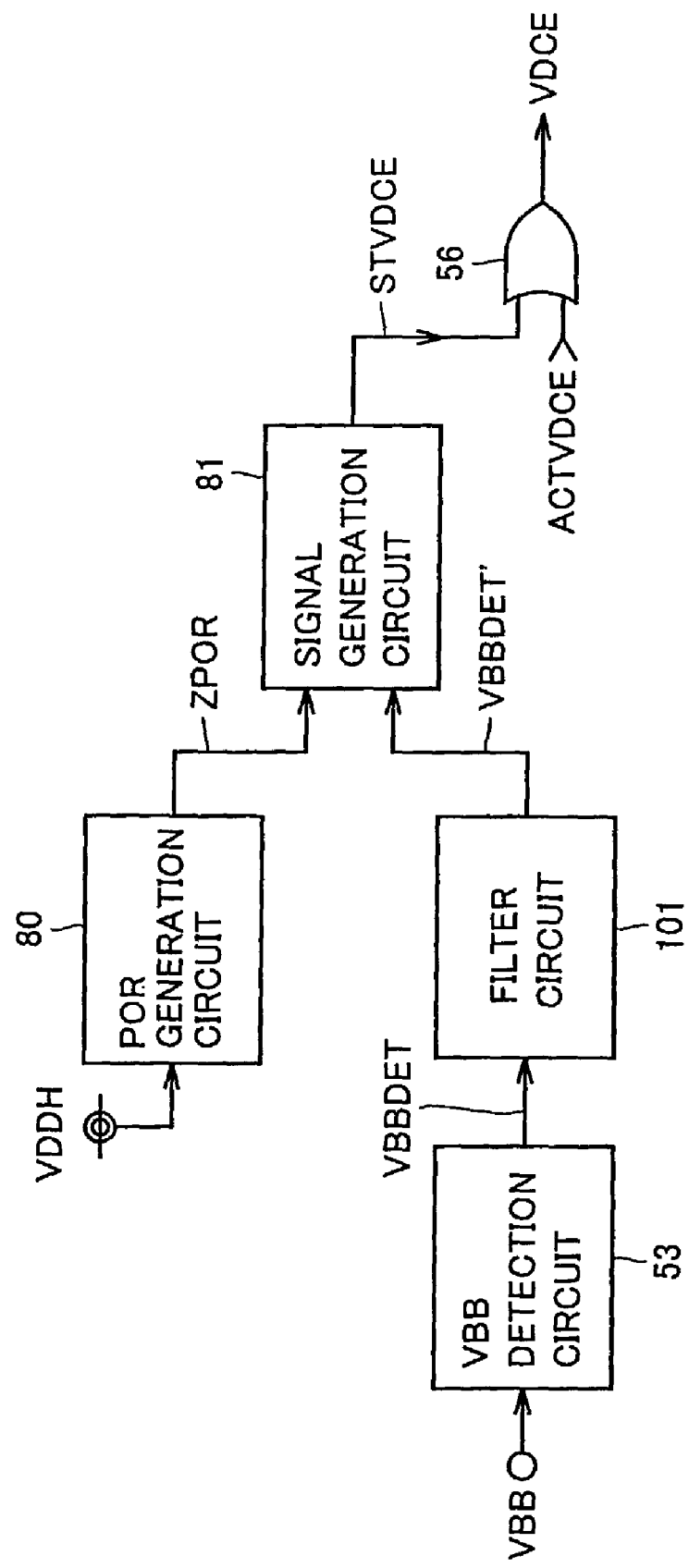
FIG. 18 is a circuit block diagram showing the important parts of an internal power generation circuit of SDRAM in the third embodiment according to the present invention.

FIG. 18 is a circuit block diagram which shows the important parts of the internal potential generation circuit of SDRAM in the third embodiment according to the present invention. Referring to FIG. 18, this internal potential generation circuit differs from that shown in FIG. 13 in that a filter circuit 101 is interposed between VBB detection circuit 53 and signal generation circuit 81.

Figure 19:
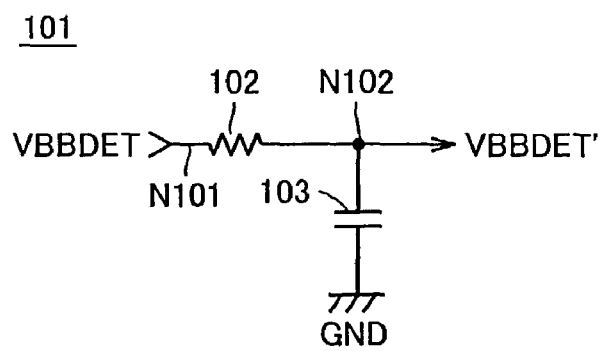
FIG. 19 is a circuit diagram showing the configuration of a filter circuit shown in FIG. 18.

Filter circuit 101 is a low-pass filter. As shown in FIG. 19, filter circuit 101 includes a resistance element 102 which is connected between an input node N101 and an output node N102, and a capacitor 103 which is connected between output node N102 and a ground potential GND line.

If input node N101 is set at "L" level while input node N101 and output node N102 are both at "H" level, charges accumulated in capacitor 103 are discharged to input node N101 through resistance element 102. If input node N101 is set at "H" level again before the charges of capacitor 103 are discharged and the level of output node N102 is made "L" level, the level of output node N102 remains "H" level. Further, if input node N101 is set at "H" level while input node N101 and output node N102 are both at "L" level, a current is carried to capacitor 103 from input node N101 through resistance element 102. If input node N 101 is set at "L" level again before capacitor 103 is charged and the level of output node N102 is made "H" level, the level of output node N102 remains "L" level.

Figure 20:
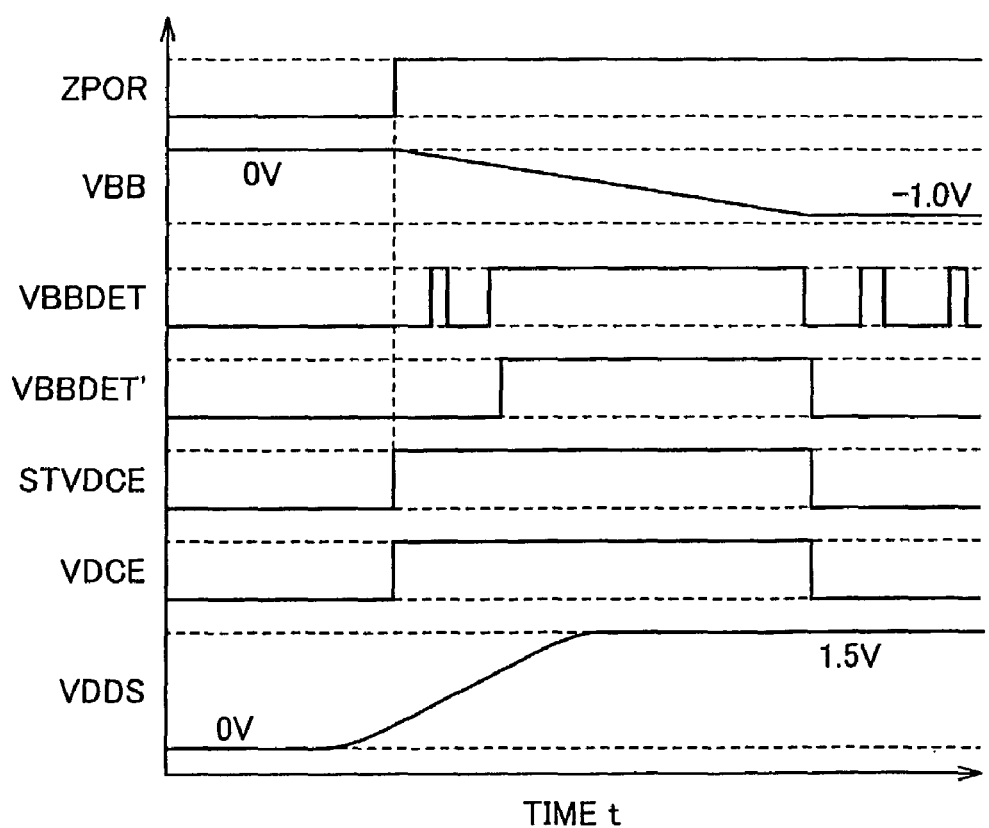
FIG. 20 is a time chart showing the operations of the internal potential generation circuit shown in FIGS. 18 and 19.

FIG. 20 is a time chart showing the operations of the internal potential generation circuit shown in FIGS. 18 and 19. Referring to FIG. 20, even if the operation of VBB detection circuit 53 becomes unstable and signal VBBDET changes in a pulse fashion, a signal VBBDET' does not change. It is, therefore, possible to prevent a period in which signal STVDCE is set at "H" level from being shortened and to prevent internal power supply potential VDDS from greatly changing.

Fourth Embodiment

Figure 21:
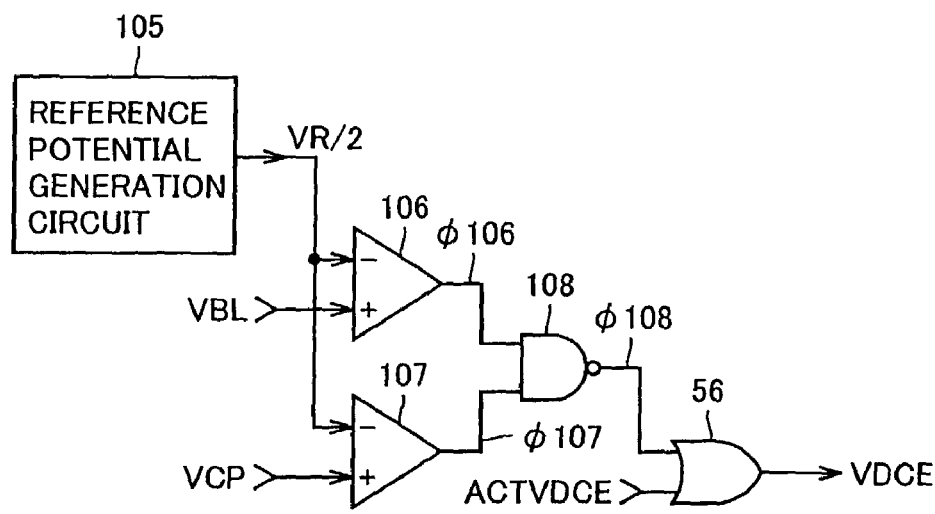
FIG. 21 is a circuit block diagram showing the important parts of an internal power generation circuit of SDRAM in the fourth embodiment according to the present invention.

FIG. 21 is a circuit block diagram which shows the important parts of the internal potential generation circuit of SDRAM in the fourth embodiment according to the present invention. Referring to FIG. 21, this internal potential generation circuit differs from internal potential generation circuit 50 shown in FIG. 7 in that a reference potential generation circuit 105, comparators 106 and 107 and a NAND gate 108 are added and that the output signal φ108 of NAND gate 108 instead of output signal VBBON of VBBH detection circuit 52 is inputted into OR gate 56.

Reference potential generation circuit 105 generates a potential VR/2 (0.75 V) which is a half of reference potential VR (1.5 V). Comparator 106 compares bit line precharge potential VBBL with reference potential VR/2. Comparator 106 sets a signal φ106 at "L" level if VBL is lower than VR/2, and sets signal φ106 at "H" level if VBL is higher than VR/2. Comparator 107 compares cell plate potential VCP with reference potential VR/2. Comparator 107 sets a signal φ107 at "L" level if VCP is lower than VR/2, and sets signal φ107 at "H" level if VCP is higher than VR/2. NAND gate 108 receives output signals φ106 and φ107 of comparators 106 and 107 and the output signal φ108 of NAND gate 108 is inputted into OR gate 56 in place of signal VBBON.

Figure 22:
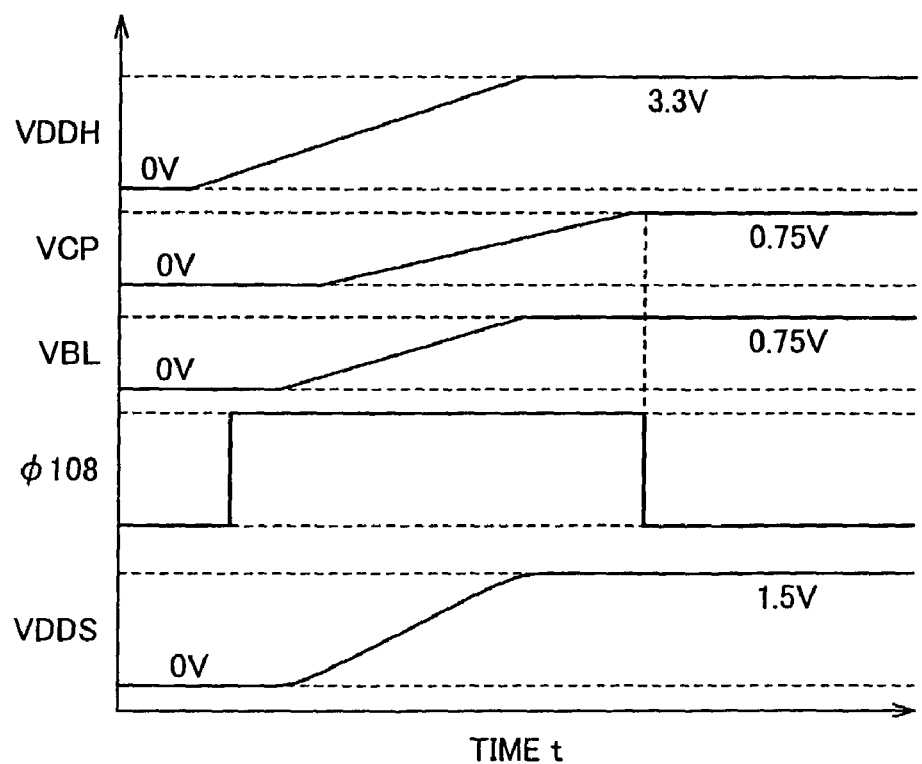
FIG. 22 is a time chart showing the operations of the internal potential generation circuit shown in FIG. 21.

FIG. 22 is a time chart which shows the operations of internal potential generation circuit shown in FIG. 21. Referring to FIG. 22, in an initial state, external power supply potential VDDH is set at 0 V, internal potentials VCP, VBB and VDDS are set at 0V and signal φ108 is also set at "L" level. If external power supply potential VDDH is applied at certain time, then the level of output signal φ108 of NAND gate 108 is raised to "H" level, active VDDS generation circuit 57 is activated and internal potentials VDDS, VCP and VBL rise. If bit line precharge potential VBL reaches VR/2, the level of output signal φ106 of comparator 106 is raised to "H" level. If cell plate potential VCP reaches VR/2, the level of output signal φ107 of comparator 107 is raised to "H" level. In accordance with the setting of the levels of signals φ106 and φ107 both at "H" level, the level of output signal φ108 of NAND gate 108 is lowered to "L" level.

In this fourth embodiment, active VDDS generation circuit 57 is also activated in a period after application of external power supply potential VDDH and until both internal potentials VCP and VBL reach VR/2. It is, therefore, possible to prevent internal power supply potential VDDS from greatly changing when external power supply potential VDDH is input and to smoothly raise internal power supply potential VDDS.

Fifth Embodiment

Figure 23:
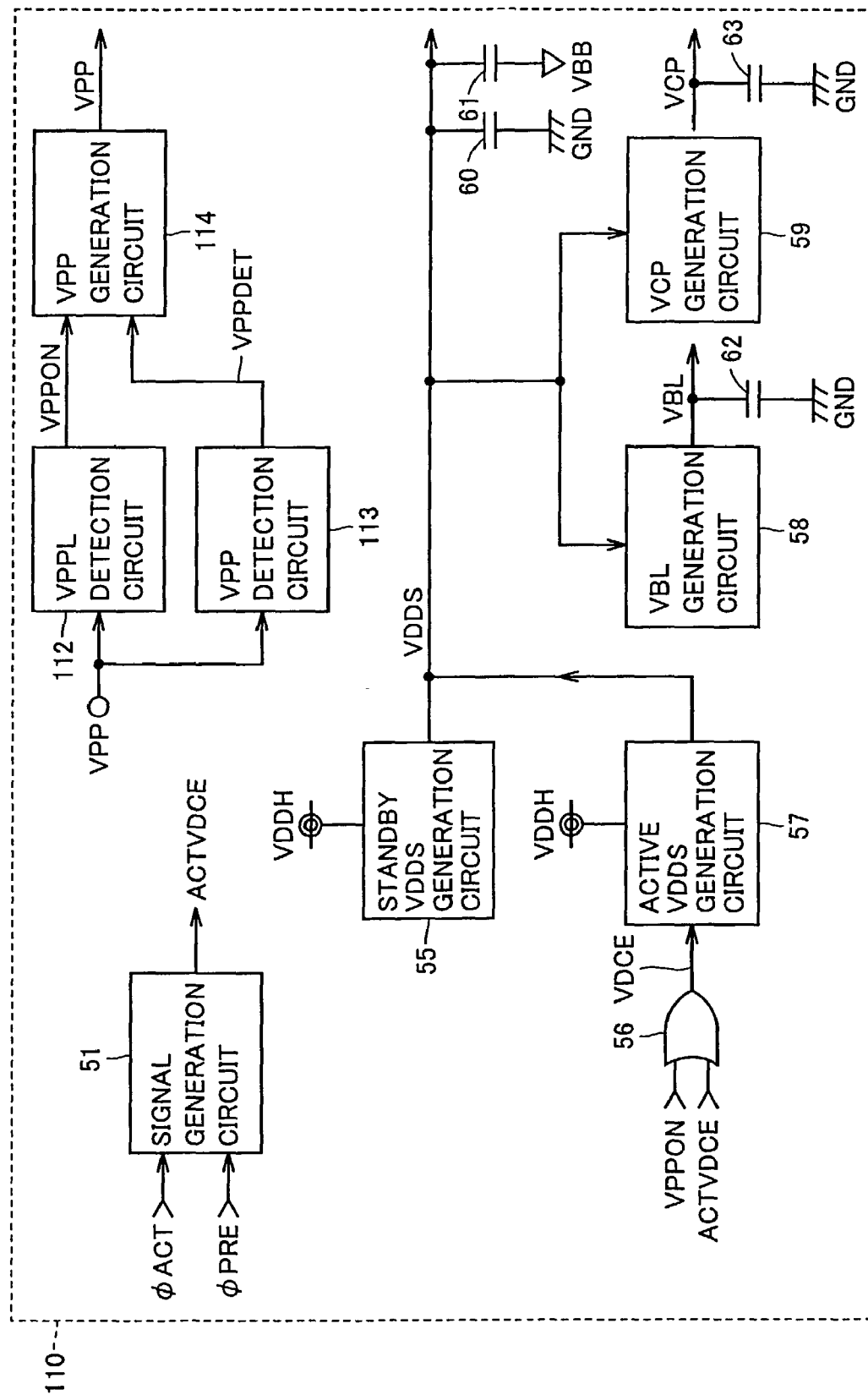
FIG. 23 is a circuit block diagram showing the important parts of an internal potential generation circuit of SDRAM in the fifth embodiment according to the present invention.

FIG. 23 is a circuit block diagram which shows the configuration of the internal potential generation circuit 110 of SDRAM in the fifth embodiment according to the present invention, as a comparison to FIG. 7. Referring to FIG. 23, internal potential generation circuit 110 differs from internal potential generation circuit 50 shown in FIG. 7 in that the output signal VPPON of a VPPL detection circuit 112 instead of output signal VBBON of VBBH detection circuit 52 is inputted into OR gate 56.

Namely, internal potential generation circuit 110 includes VPPL detection circuit 112, a VPP detection circuit 113 and a VPP generation circuit 114. VPPL detection circuit 112 sets signal VPPON at "H" level if boosted potential VPP is lower than 3.0 V and sets signal VPPON at "L" level if boosted potential VPP is higher than 3.0 V. VPP detection circuit 113 sets signal VPPDET at "H" level if boosted potential VPP is lower than 3.6 V and sets signal VPPDET at "L" level if boosted potential VPP is higher than 3.6 V.

VPP generation circuit 114 is driven by external power supply potential VDDH, supplies positive charges to a boosted potential VPP line with relatively high charge supply capability if signals VPPON and VPPDET are both at "H" level, supplies positive charges to the boosted potential VPP line with relatively low charge supply capability if signals VPPON and VPPDET are at "L" level and "H" level, respectively, and stops supplying positive charges if signals VPPON and VPPDET are both at "L" level. Since the remaining constitution is equal to that of internal potential generation circuit 50 shown in FIG. 7, it will not be repeatedly described herein. Although a circuit which generates negative potential VBB is also provided in internal potential generation circuit 110, it is not shown in the drawing and not described herein.

Figure 24:
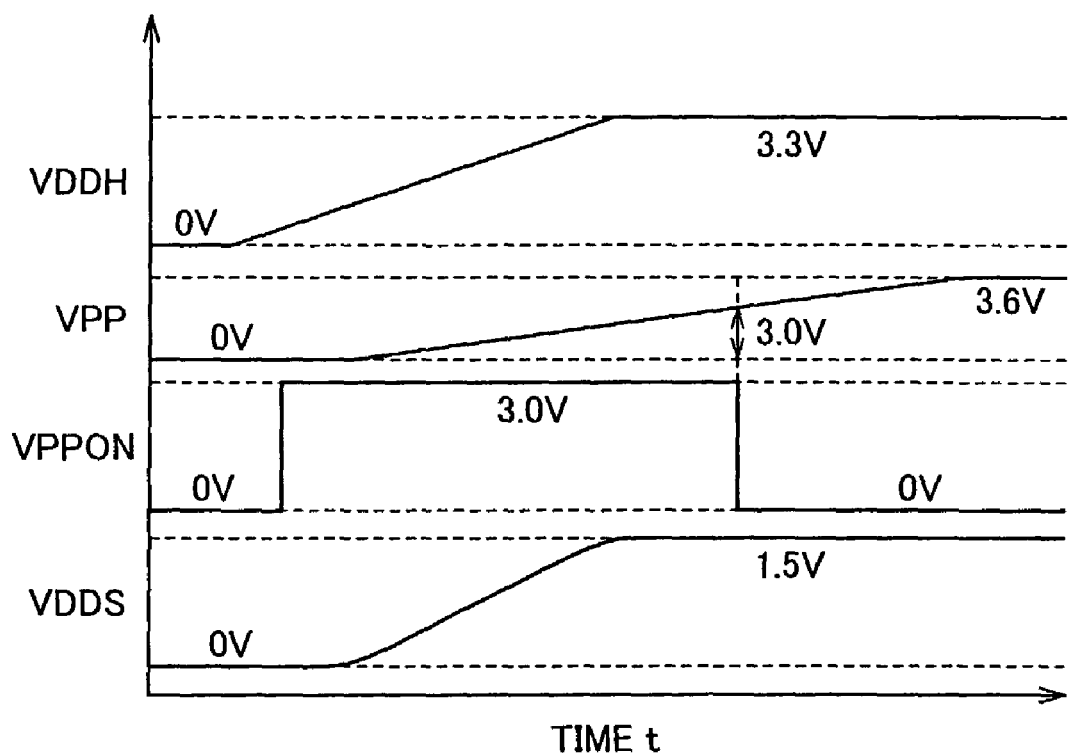
FIG. 24 is a time chart showing the operations of the internal potential generation circuit shown in FIG. 23.

FIG. 24 is a time chart which shows the operations of internal potential generation circuit 110 shown in FIG. 23. Referring to FIG. 24, in an initial state, external power supply potential VDDH is set at 0 V and internal potentials VPP and VDD and signal VPPON are also set at 0 V. If external power supply potential VDDH is applied at certain time, the level of signal VPPON is raised from "L" level to "H" level and VPP generation circuit 114, standby VDDS generation circuit 55, active VDDS generation circuit 57, VBL generation circuit 58 and VCP generation circuit 59 are activated. As a result, boosted potential VPP and internal power supply potential VDDS gradually rise. At this moment, active VDDS generation circuit 57 which is high in charge supply capability and response is activated, so that internal power supply potential VDDS does not greatly change or rock unlike the conventional art.

If boosted potential VPP reaches 3.0 V, the level of signal VPPON is lowered from "H" level to "L" level and active VDDS generation circuit 57 is deactivated. Following this, active VDDS generation circuit 57 is activated only when internal power supply potential VDDS is largely consumed, i.e., only during a period after active command ACT is input and until precharge command PRE is input.

This fifth embodiment can attain the same advantages as those of the first embodiment. Various modifications of the fifth embodiment will now be described. In the modification shown in FIG. 25, output signal VPPDET of VPP detection circuit 113 is inputted into OR gate 56 in place of output signal VBBON of VPPL detection circuit 112. In this case, the time for which active VDDS generation circuit 57 is activated when external power supply potential VDDH is inputted is longer than that in the fifth embodiment.

Figure 25:
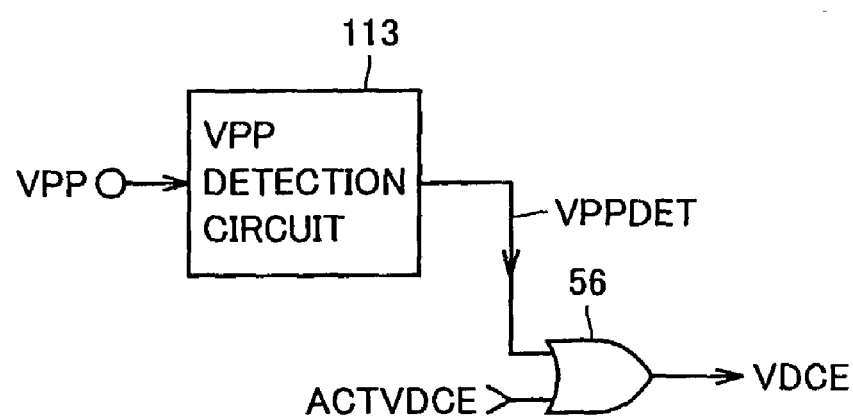
FIG. 25 is a circuit block diagram showing a modification of the fifth embodiment.
Figure 26:
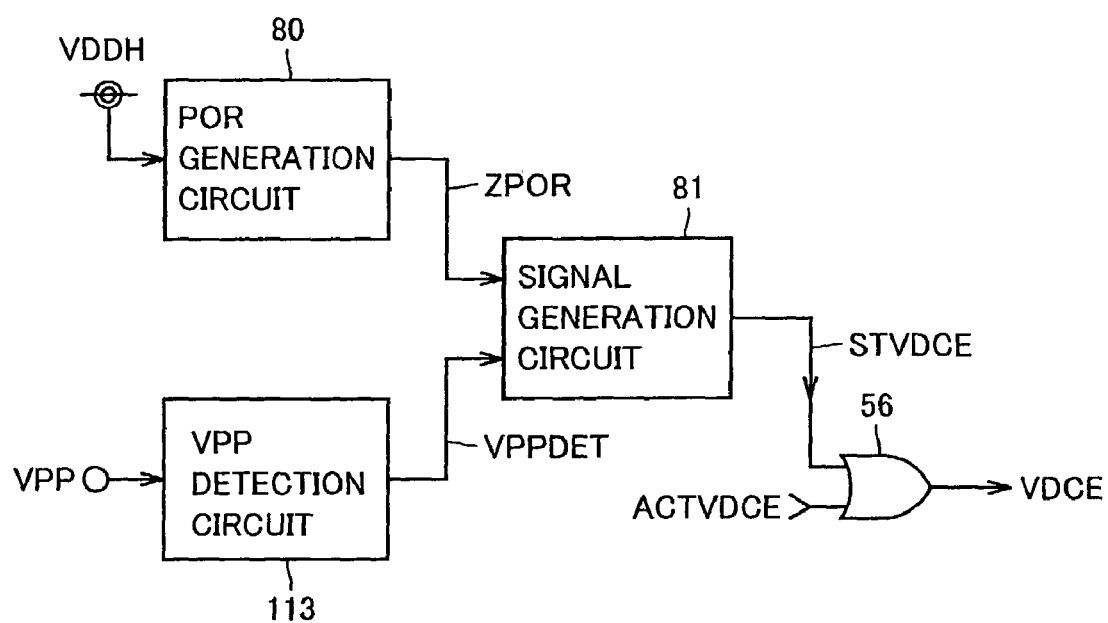
FIG. 26 is a circuit block diagram showing another modification of the fifth embodiment.

In the modification shown in FIG. 26, POR generation circuit 80 and signal generation circuit 81 are added to the configuration of the modification shown in FIG. 25. POR generation circuit 80 and signal generation circuit 81 are the same as those described in the second embodiment. Signal generation circuit 81 sets signal STVDCE at "H" level when the level of output signal ZPOR of POR generation circuit 80 is set at "H" level, and sets signal STVDCE at "L" level when the level of output signal VPPDET of VPP detection circuit 113 is set at "L" level. Signal STVCE is inputted into OR gate 56 in place of signal VPPDET. In this modification, active VDDS generation circuit 57 is also activated in a period since the level of signal ZPOR is raised to "H" level until boosted potential VPP reaches 3.6 V. It is, therefore, possible to smoothly raise internal power supply potential VDDS.

Figure 27:
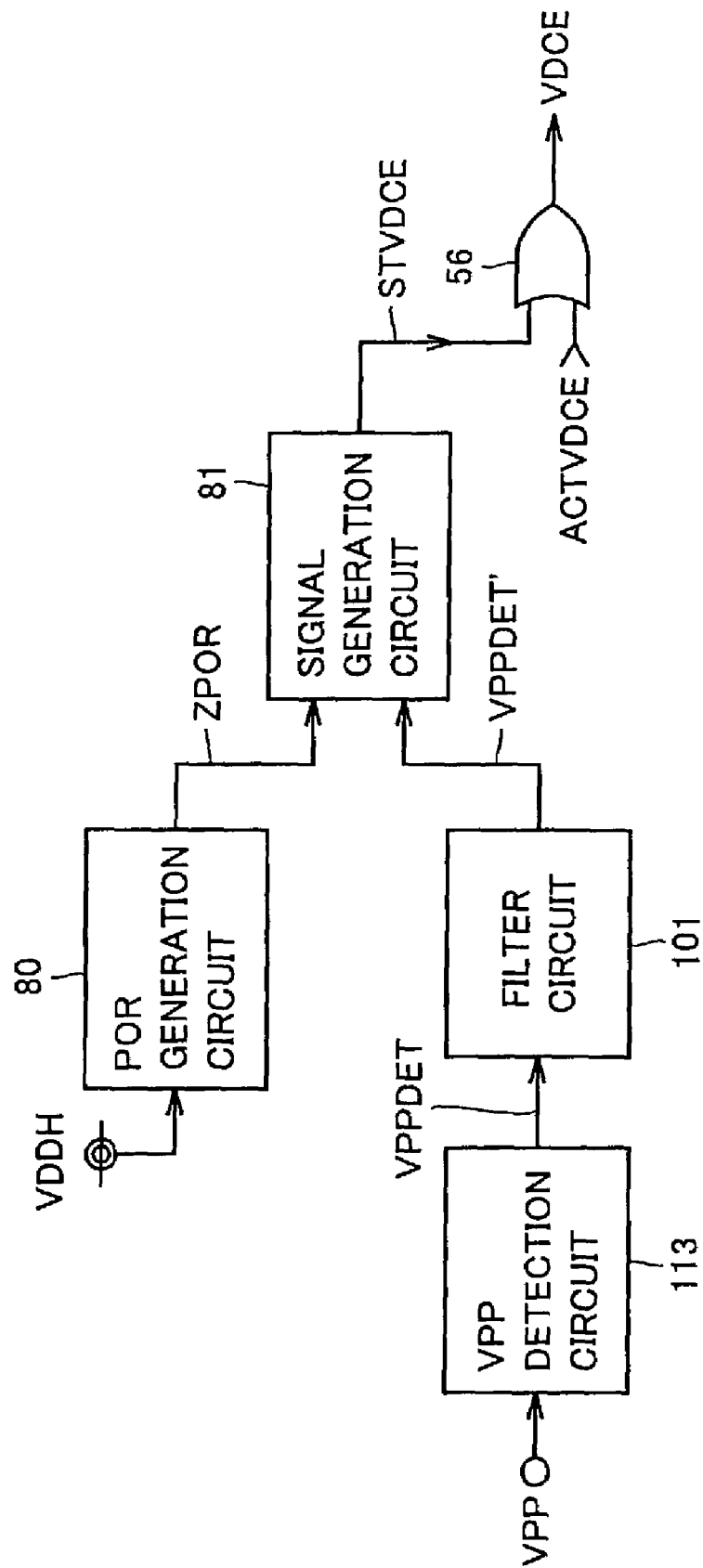
FIG. 27 is a circuit block diagram showing yet another modification of the fifth embodiment.
Figure 28:
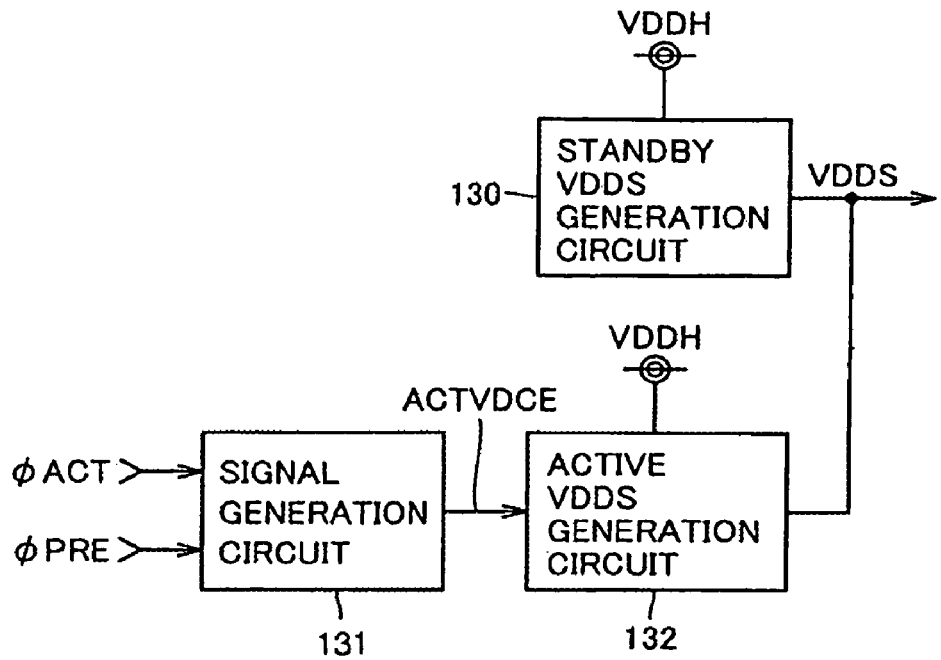
FIG. 28 is a circuit block diagram showing the important parts of an internal potential generation circuit of conventional DRAM.

In the modification shown in FIG. 27, filter circuit 101 is added to the configuration of the modification shown in FIG. 26. Filter circuit 101 is the same as that described in the third embodiment. Filter circuit 101 is interposed between VPP detection circuit 113 and signal generation circuit 81. Even if the operation of VPP detection circuit 113 becomes unstable and signal VPPDET changes in a pulse fashion, the output signal VPPDET' of filter circuit 101 does not change. It is, therefore, possible to prevent a period in which signal STVDCE of signal generation circuit 81 is set at "H" level from being shortened and to prevent internal power supply potential VDD from greatly changing or rocking.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a standby mode and an active mode, comprising:
   a first internal power supply potential generation circuit having a first current driving force, and driven by an external power supply potential to generate an internal power supply potential not exceeding the external power supply potential;
   a second internal power supply potential generation circuit having a second current driving, force higher than the first current driving force, activated in a period when the external power supply potential is applied and in an active mode, driven by the external power supply potential, and generating the internal power supply potential;
   an internal circuit driven by the internal power supply potential;
   an internal potential generation circuit driven by the external power supply potential, and generating an internal potential; and
   an internal potential detection circuit setting a detection signal to an active level when the external power supply potential is applied, and setting the detection signal to an inactive level when the internal potential reaches a first potential, wherein, in the period, the detection signal is at the active level.

2. A semiconductor device having a standby mode and an active mode, comprising:
   a first internal power supply potential generation circuit having a first current driving force, and driven by an external power supply potential to generate an internal power supply potential not exceeding the external power supply potential;
   a second internal power supply potential generation circuit having a second current driving force, higher than the first current driving force, activated in a period when the external power supply potential is applied and in an active mode, driven by the external power supply potential, and generating the internal power supply potential;
   an internal circuit driven by the internal power supply potential;
   an internal potential generation circuit driven by the external power supply potential, and generating an internal potential;
   an internal potential detection circuit setting a detection signal to an active level when the external power supply potential is applied, and setting the detection signal to an inactive level when the internal potential reaches a first potential;
   a first signal generation circuit setting a power-on reset signal at the active level when the external power supply potential is applied, and setting the power-on reset signal to an inactive level when the external power supply potential reaches a second potential; and
   a second signal generation circuit setting a control signal to an active level when the power-on reset signal is at the inactive level, and setting the control signal to an inactive level when the detection signal is at the inactive level, wherein, in the period, the control signal is at the active level.

3. The semiconductor device according to claim 2, further comprising a low-pass filter interposed between said internal potential detection circuit and said second signal generation circuit.

4. The semiconductor device according to claim 1, wherein the first potential is a potential between a ground potential and a reference potential, and the internal potential is kept equal to the reference potential.

5. The semiconductor device according to claim 1, wherein the first potential is a reference potential, and the internal potential is kept equal to the reference potential.

6. The semiconductor device according to claim 1, wherein said internal circuit includes:
   a memory array including a plurality of memory cells arranged in a plurality of rows and a plurality of columns, a plurality of word lines corresponding to said plurality of rows, respectively, and a plurality of bit line pairs corresponding to said plurality of columns, respectively;

a sense amplifier corresponding to each of said bit line pairs, driven by the internal power supply potential, and amplifying a potential difference between the corresponding bit line pair;

a row select circuit selecting one of said plurality of word lines in accordance with a row address signal, making the word line selected have a select potential to activate the respective memory cells corresponding to the word line, and generating the potential difference between each of the bit line pairs;

a column select circuit selecting one of said plurality of bit line pairs in accordance with a column address signal; and a write/read circuit writing/reading a data signal of said memory cell activated by said row select circuit through the bit line pair selected by said column select circuit.

7. The semiconductor device according to claim 6, wherein each of said memory cells includes an N-type transistor on a surface of a P-type well, and the internal potential is applied to said P-type well.

8. The semiconductor device according to claim 6, wherein the internal potential is a select potential applied to said word line by said row select circuit.

9. A semiconductor device having a standby mode and an active mode, comprising:

a first internal power supply potential generation circuit having a first current driving force, and driven by an external power supply potential to generate an internal power supply potential not exceeding the external power supply potential;

a second internal power supply potential generation circuit having a second current driving force, higher than the first current driving force, activated in a period when the external power supply potential is applied and in an active mode, driven by the external power supply potential and generating the internal power supply potential;

an internal circuit driven by the internal power supply potential;

a first internal potential generation circuit driven by the internal power supply potential, and generating a first internal potential;

a second internal potential generation circuit driven by the internal power supply potential, and generating a second internal potential; and an internal potential detection circuit setting a detection signal to an active level when the external power supply potential is applied, and setting the detection signal to an inactive level when both the first and second internal potentials reach a reference potential, wherein, in the period, the detection signal is at the active level.

10. The semiconductor device according to claim 9, wherein said internal circuit includes:

a memory array including a plurality of memory cells arranged in a plurality of rows and a plurality of columns, a plurality of word lines corresponding to said plurality of rows, respectively, and a plurality of bit line pairs corresponding to said plurality of columns, respectively;

a sense amplifier corresponding to each of said bit line pairs, driven by the internal power supply potential, and amplifying a potential difference between the corresponding bit line pair;

a row select circuit selecting one of said plurality of word lines in accordance with a row address signal, making the word line selected have a select potential to activate the respective memory cells corresponding to the word line, and generating the potential difference between each of the bit line pairs;

a column select circuit selecting one of said plurality of bit line pairs in accordance with a column address signal; and a write/read circuit writing/reading a data signal of said memory cell activated by said row select circuit through the bit line pair selected by said column select circuit, wherein each of said memory cells includes a transistor and a capacitor, the first internal potential is a cell plate potential applied one electrode of said capacitor, the second internal potential is a bit line precharge potential applied to said bit line pair before each of said memory cells is activated, and each of the first and second internal potentials is half of the internal power supply potential.

* * * * *